(12) United States Patent
Feng et al.

(10) Patent No.: US 7,884,452 B2
(45) Date of Patent: Feb. 8, 2011

(54) SEMICONDUCTOR POWER DEVICE PACKAGE HAVING A LEAD FRAME-BASED INTEGRATED INDUCTOR

(75) Inventors: Tao Feng, Santa Clara, CA (US);
Xiaotian Zhang, San Jose, CA (US);
François Hébert, San Mateo, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 434 days.

(21) Appl. No.: 11/986,673

(22) Filed: Nov. 23, 2007

(65) Prior Publication Data
US 2009/0134503 A1    May 28, 2009

(51) Int. Cl.
*H01L 23/495* (2006.01)
*H01F 5/00* (2006.01)

(52) U.S. Cl. ............... 257/666; 336/200; 257/E21.022; 257/E21.51

(58) Field of Classification Search ................. 257/666, 257/673, E21.51, E21.022, E23.054, E23.031, 257/E23.032, E23.042; 336/186, 200
See application file for complete search history.

(56) References Cited

U.S. PATENT DOCUMENTS

| | | | |
|---|---|---|---|
| 3,614,554 A | 10/1971 | Shield et al. | |
| 3,858,138 A | 12/1974 | Gittleman et al. | |
| 4,103,267 A | 7/1978 | Olschewski | |
| 4,543,553 A | 9/1985 | Mandai et al. | |
| 5,032,815 A | 7/1991 | Kobayashi et al. | |
| 5,041,903 A | 8/1991 | Millerick et al. | |
| 5,070,317 A | 12/1991 | Bhagat | |
| 5,425,166 A | 6/1995 | Hastings et al. | |
| 5,428,245 A | 6/1995 | Lin et al. | |
| 5,469,334 A | 11/1995 | Balakrishnan et al. | |
| 5,886,393 A | 3/1999 | Merrill et al. | |
| 5,959,846 A | 9/1999 | Noguchi et al. | |
| 6,236,538 B1 | 5/2001 | Yamada et al. | |
| 6,429,764 B1 | 8/2002 | Karam et al. | |
| 6,608,367 B1 | 8/2003 | Gibson et al. | |
| 6,621,140 B1 | 9/2003 | Gibson et al. | |
| 6,630,881 B1 | 10/2003 | Takeuchi et al. | |
| 6,765,284 B2 | 7/2004 | Gibson et al. | |

(Continued)

OTHER PUBLICATIONS

USPTO Office Action for U.S. Appl. No. 12/011,489, mailing date Mar. 19, 2010.

(Continued)

*Primary Examiner*—Matthew C Landau
*Assistant Examiner*—Jessica Hall
(74) *Attorney, Agent, or Firm*—Jingming Cai; Schein & Cai LLP

(57) ABSTRACT

A semiconductor power device package having a lead frame-based integrated inductor is disclosed. The semiconductor power device package includes a lead frame having a plurality of leads, a inductor core attached to the lead frame such that a plurality of lead ends are exposed through a window formed in the inductor core, a plurality of bonding wires, ones of the plurality of bonding wires coupling each of the plurality of lead ends to adjacent leads about the inductor core to form the inductor, and a power integrated circuit coupled to the inductor. In alternative embodiments, a top lead frame couples each of the plurality of lead ends to adjacent leads about the inductor core by means of a connection chip.

24 Claims, 19 Drawing Sheets

U.S. PATENT DOCUMENTS

| | | |
|---|---|---|
| 6,847,104 B2 | 1/2005 | Huang et al. |
| 6,927,481 B2 | 8/2005 | Gibson et al. |
| 6,930,584 B2 | 8/2005 | Edo et al. |
| 6,998,952 B2 * | 2/2006 | Zhou et al. .................. 336/200 |
| 7,046,114 B2 | 5/2006 | Sakata |
| 7,091,576 B2 | 8/2006 | Yamamoto et al. |
| 7,167,073 B2 | 1/2007 | Hatano |
| 7,196,514 B2 | 3/2007 | Li |
| 7,229,908 B1 | 6/2007 | Drizlikh et al. |
| 7,268,659 B2 | 9/2007 | Nishio et al. |
| 7,368,908 B2 | 5/2008 | Yamada |
| 7,622,796 B2 | 11/2009 | Shi et al. |
| 7,786,837 B2 | 8/2010 | Hebert |
| 2002/0097128 A1 | 7/2002 | Imam |
| 2003/0070282 A1 | 4/2003 | Hiatt et al. |
| 2004/0169266 A1 | 9/2004 | Maxwell |
| 2004/0212475 A1 | 10/2004 | Schumacher |
| 2006/0227518 A1 | 10/2006 | Nishio et al. |
| 2007/0026676 A1 | 2/2007 | Li et al. |
| 2008/0061918 A1 | 3/2008 | Greiff |
| 2008/0094165 A1 | 4/2008 | Orlando et al. |
| 2008/0238599 A1 | 10/2008 | Hebert et al. |
| 2009/0057822 A1 * | 3/2009 | Wen et al. .................... 257/531 |
| 2010/0007456 A1 | 1/2010 | Joehren et al. |

OTHER PUBLICATIONS

USPTO Office Action for U.S. Appl. No. 12/011,489, mailing date Aug. 19, 2010.

USPTO Office Action for U.S. Appl. No. 12/397,473, mailing date Sep. 15, 2010.

International Preliminary Report on Patentability for International Patent Application No. PCT/US08/013043, mailing date Jun. 3, 2010.

International Search Report for International Patent Application No. PCT/US08/013043, mailed Jan. 26, 2009.

Written Opinion for International Patent Application No. PCT/US08/013043, mailing date Jan. 26, 2009.

* cited by examiner

SEMICONDUCTOR POWER DEVICE PACKAGE HAVING A LEAD FRAME-BASED INTEGRATED INDUCTOR

BACKGROUND OF THE INVENTION

1. Field of the Invention

The present invention generally relates to semiconductor power devices and more particularly to a semiconductor power device package having a lead frame-based integrated inductor.

2. Description of Related Art

It is well known to include a discrete inductor on the printed circuit board when implementing a power converter circuit. For example, the Analogic™ TECH 1 MHz 400 mA Step-Down Converter (AAT1143) requires the use of a discrete inductor. Power converters implemented in this way suffer the disadvantages of having higher component cost and of requiring more printed circuit board space.

Discrete inductors co-packaged with power ICs and other components are also well known. For example, the LTM®4600 DC/DC power converter available from Linear Technology Corporation of Milpitas, Calif., includes a built-in inductor in a 15 mm×15 mm×2.8 mm package. The large package size demonstrates the challenge of finding a discrete inductor small enough to be co-packaged with the power IC, yet having a large inductance, small DC resistance and large rated current capable of meeting power conversion requirements. Furthermore, utilizing a discrete inductor is not cost effective as the cost of the final package includes duplicative component assembly costs (the cost of assembling the discrete inductor and of the final package) and the additional cost of incorporating the discrete inductor in the final package.

It is known to dispose the integrated circuit die on top of the inductor to achieve smaller package sizes. As disclosed in U.S. Pat. No. 6,930,584, a microminiature power converter includes a substrate magnetic induction element on top of which is mounted the power IC. Disadvantageously, the induction element is exposed allowing the fragile substrate material to be easily damaged.

It is further known to dispose an inductor on top of an integrated circuit die such as a power converter integrated circuit die. For example, power converters available from Enpirion of Bridgewater, N.J., include a MEMS-based inductor having a thick electroplated copper spiral coil sandwiched between two planar magnetic layers and disposed over an integrated DC-DC converter. To achieve high inductance, a large die is required resulting in a high cost and a large package. Furthermore, complex processing is necessary in order to fabricate the planar magnetic layers.

Efforts directed at reducing package size include utilizing the lead frame as an element of the inductor. For example, U.S. Pat. No. 5,428,245 discloses forming an inductor winding as an integral part of the lead frame and U.S. Pat. No. 6,927,481 discloses forming inductive segments as part of the lead frame. These designs are suitable for RF applications, but lacking magnetic core material, they provide relatively small inductances that are not sufficient for power conversion applications.

There remains a need in the art for a semiconductor power device package having an integrated inductor that is simple to manufacture and that achieves improved cost performance. There is also a need for a semiconductor power device package having an integrated inductor that has a large inductance, a small DC resistance, a large rated current and a low loss, all sufficient for power conversion applications. There is a further need for a semiconductor power device package having an integrated inductor that has a relatively small size.

SUMMARY OF THE INVENTION

The semiconductor power device package having an integrated inductor of the invention fulfills these needs and provides advantages over the prior art by utilizing the lead frame and metal connections such as bonding wires, in combination with an inductor core, to provide an integrated inductor having high inductance and low DC resistance and which is low-cost and space efficient. Alternatively, two lead frames, in combination with an inductor core, are utilized to provide the integrated inductor. The entire structure is protected by a molding compound to protect the integrated inductor and IC chip.

In accordance with one aspect of the invention, a semiconductor power device package includes a lead frame having a plurality of leads, an inductor core attached to the lead frame such that a plurality of lead ends are exposed through a window formed in the inductor core, a plurality of metal connections, ones of the plurality of metal connections coupling each of the plurality of lead ends to adjacent leads about the inductor core to form the inductor, and a power integrated circuit coupled to the inductor.

In accordance with one aspect of the invention, a semiconductor power device package having a lead frame-based integrated inductor includes a bottom lead frame having a plurality of leads, an inductor core attached to the bottom lead frame such that a plurality of bottom lead frame lead ends are exposed through a window formed in the inductor core, a connection chip bumped on opposite sides thereof and disposed in the window such that bottom side bumps overlay the plurality of bottom lead frame lead ends and are electrically coupled thereto, a top lead frame having a plurality of bent leads, ones of a first plurality of the plurality of top lead frame leads coupled to connection chip top side bumps and coupling each of the plurality of bottom lead frame lead ends to adjacent bottom lead frame leads about the inductor core to form the inductor, and a power integrated circuit coupled to the inductor.

There has been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended herein.

In this respect, before explaining at least one embodiment of the invention in detail, it is to be understood that the invention is not limited in its application to the details of functional components and to the arrangements of these components set forth in the following description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF A PREFERRED EMBODIMENT OF THE INVENTION

The present invention will now be described in detail with reference to the drawings, which are provided as illustrative examples of the invention so as to enable those skilled in the art to practice the invention. Notably, the figures and examples below are not meant to limit the scope of the present invention. Where certain elements of the present invention can be partially or fully implemented using known components, only those portions of such known components that are necessary for an understanding of the present invention will be described, and detailed descriptions of other portions of such known components will be omitted so as not to obscure the invention. Further, the present invention encompasses present and future known equivalents to the components referred to herein by way of illustration.

The present invention provides a semiconductor power device package having a lead frame-based integrated inductor. Embodiments of the invention include an inductor core having a window formed therein through which bonding wires couple lead frame leads one to another to form an electric coil around the inductor core thereby forming a closed magnetic path of the integrated inductor. In alternative embodiments, second lead frame leads couple the first lead frame leads one to another to form the closed magnetic path of the integrated inductor. The inductor core is preferably of toroidal configuration and between 0.2 mm and 1 mm thick depending upon total package thickness requirements. The inductor core may be formed of ferrite or nanocrystalline NiFe for high frequency applications and of NiFe or other suitable magnetic materials for low frequency applications. A small gap of less than 100 um can be formed in the inductor core to adjust the magnetic properties thereof, with the resulting structure still providing a closed magnetic path.

Figure 1:
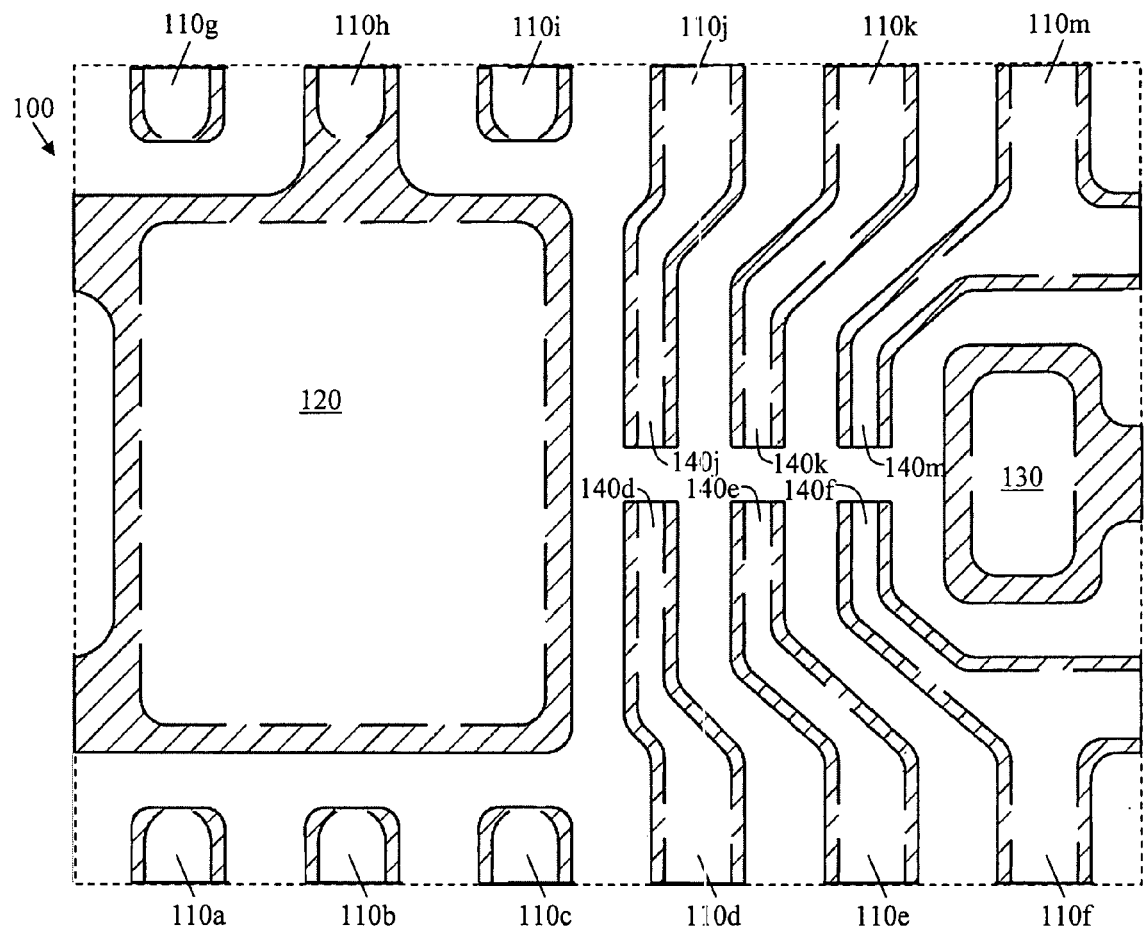
FIG. 1 is a transparent top plan view of a first lead frame in accordance with the invention.

A top side of a lead frame 100 in accordance with the invention is shown in FIG. 1. Lead frame 100 includes a plurality of leads 110a-110m, a large pad 120 and an opposed small pad 130. Leads 110d-110f have corresponding lead ends 140d-140f. Leads 110j-110m have corresponding lead ends 140j-140m. The shaded regions of the leads 110a-110m are half etched on the bottom side and a molding material fills these regions to lock the lead frame 100 to the components of the semiconductor power device package as further described herein.

Figure 2A:
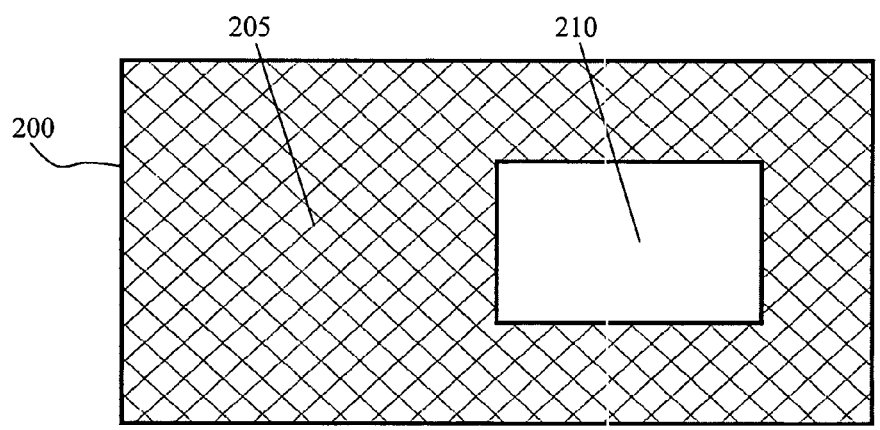
FIG. 2A is a top plan view of a inductor core in accordance with the invention.

With reference to FIG. 2A, an inductor core 200 is shown including an open surface 205 disposed adjacent an offset window 210 formed through the body of the chip. While the inductor core 200 and the offset window 210 are shown as being of rectangular configuration, other shapes are not precluded by this description. As previously noted, the inductor core 200 is preferably between 0.2 mm and 1 mm thick depending upon total package thickness requirements. The inductor core may be formed of ferrite or nanocrystalline NiFe for high frequency applications and of NiFe or other suitable magnetic materials for low frequency applications.

Figure 2B:
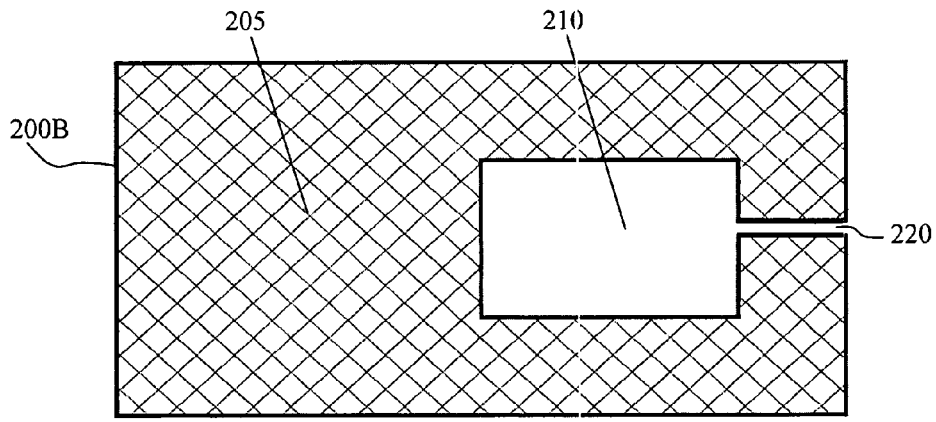
FIG. 2B is a top plan view of an inductor core with a small gap in accordance with the invention.

With reference to FIG. 2B, an inductor core 200B is shown having a small transverse gap. As noted above, the gap can be used to adjust the magnetic properties of the integrated inductor with the resulting structure still providing a closed magnetic loop. In all embodiments of this invention, an inductor core either with or without a gap can be used.

Figure 3:
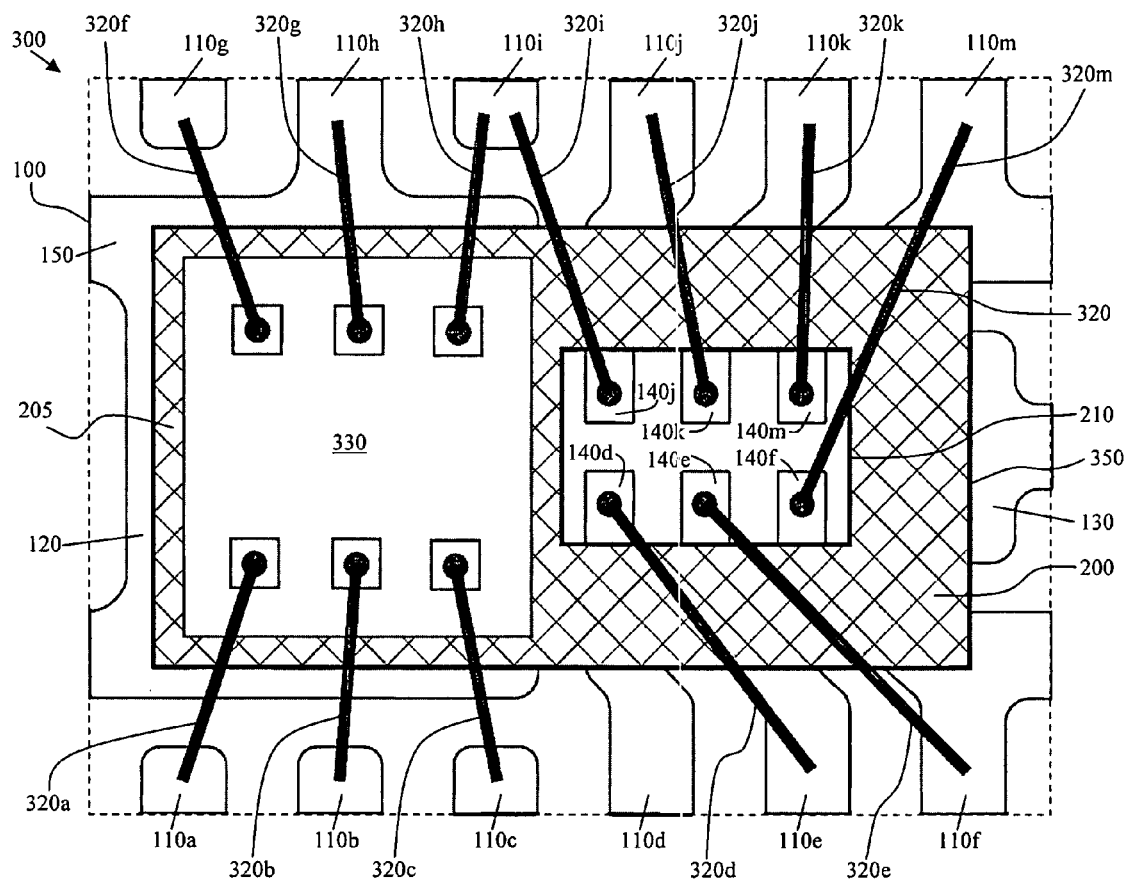
FIG. 3 is a top plan view of a first embodiment of a semiconductor power device package having a lead frame-based integrated inductor in accordance with the invention.

A first embodiment of the invention is shown in FIG. 3 and includes a semiconductor power device package 300 having a lead frame-based integrated inductor 350. The inductor 350 is comprised of the inductor core 200, a plurality of leads of the lead frame 100 and metal connections such as bonding wires 320d, 320e, 320i, 320j, 320k and 320m coupled between the plurality of leads as shown. The inductor core 200 is attached to a top surface 150 of the lead frame 100 and is supported by the large pad 120 and the small pad 130. The inductor core 200 is disposed on the top surface 150 of the lead frame 100 in such manner that lead ends 140d-140f and 140j-140m are accessible through the offset window 210.

Bonding wires 320 couple a plurality of adjacent leads of the lead frame 100 to provide a closed magnetic circuit around the inductor core 200. Bonding wire 320d couples the end 140d of the lead 110d to the adjacent lead 110e, the bonding wire 320d, the lead 110d and the adjacent lead 110e forming a loop around the inductor core 200. Bonding wire 320e couples the end 140e of the lead 110e to the adjacent lead 110f, the bonding wire 320e, the lead 110e and the adjacent lead 110f forming a loop around the inductor core 200. Bonding wire 320m couples the end 140f of the lead 110f to the adjacent lead 110m, the bonding wire 320m, the lead 110f and the adjacent lead 110m forming a loop around the inductor core 200. Bonding wire 320k couples the end 140m of the lead 110m to the adjacent lead 110k, the bonding wire 320k, the lead 110m and the adjacent lead 110k forming a loop around the inductor core 200. Bonding wire 320j couples the end 140k of the lead 110k to the adjacent lead 110j, the bonding wire 320j, the lead 110k and the adjacent lead 110j forming a loop around the inductor core 200. Bonding wire 320i couples the end 140j of the lead 110j to the adjacent lead 110i, the bonding wire 320i, the lead 110j and the adjacent lead 110i forming a loop around the inductor core 200. Leads 110d and 110i comprise the leads of the inductor 350.

As the dimensions of the offset window 210 are small, access to the lead ends therein may be limited and require the use of a specialized bonding tool such as the K&S Close Center Bond bottleneck bonding tool which can reach into the offset window 210 to attach the bonding wires 320 to the lead ends exposed therein.

A power IC 330 is attached to the open surface 205 of the inductor core 200. Bonding wire 320h couples the power IC 330 to the lead 110i and thereby to the lead frame-based integrated inductor 350. Bonding wires 320a, 320b, and 320c couple the power IC 330 to leads 110a, 110b and 110c respectively. Bonding wires 320f and 320g couple the power IC 330 to leads 110g and 110h respectively.

An encapsulant completes the semiconductor power device package 300 and fills the half-etched regions of the leads 110a-110m (FIG. 1) to lock the lead frame 100 so that leads won't detach from the package 300. The outline of the encapsulant is shown by a dashed line.

Figure 4:
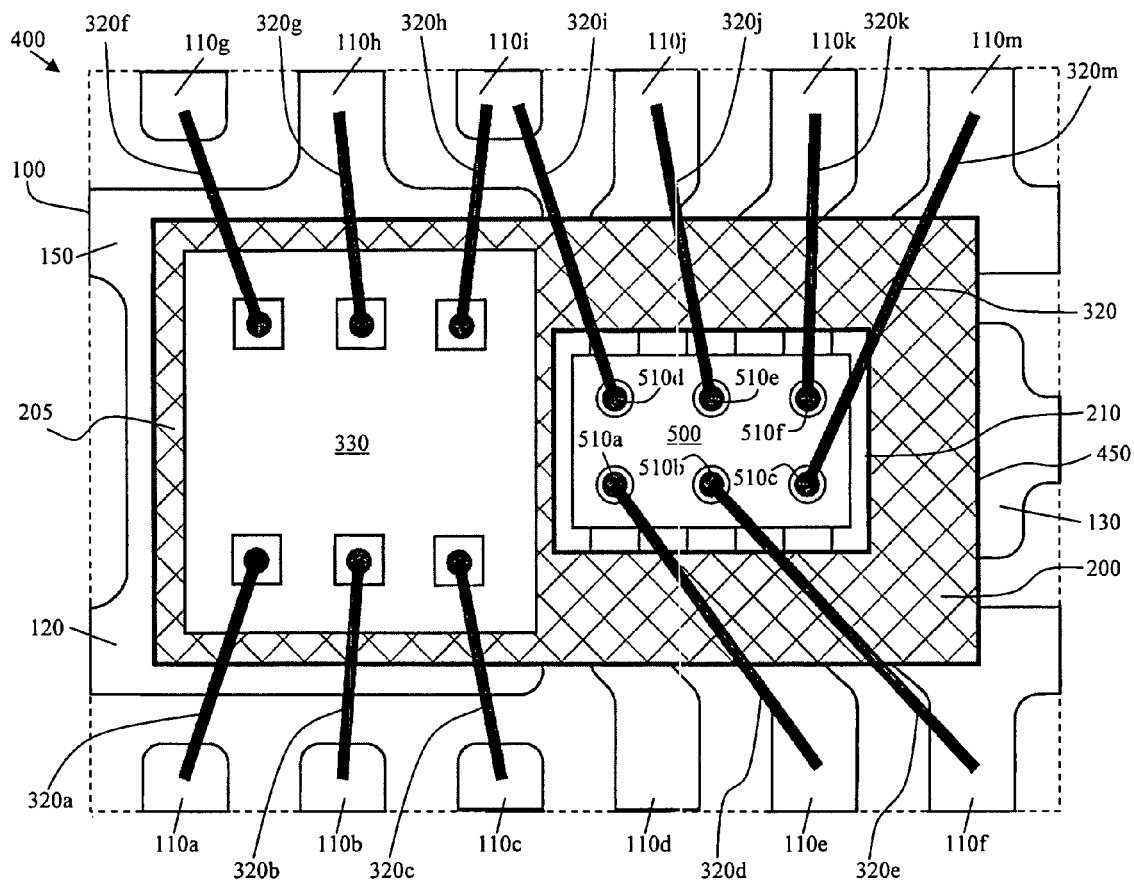
FIG. 4 is a top plan view of a second embodiment of a semiconductor power device package having a lead frame-based integrated inductor in accordance with the invention.
Figure 5:
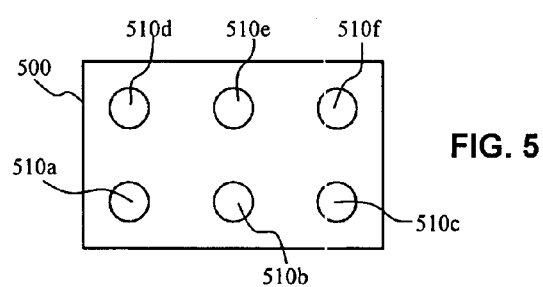
FIG. 5 is a top plan view of a connection chip in accordance with the invention.
Figure 6:
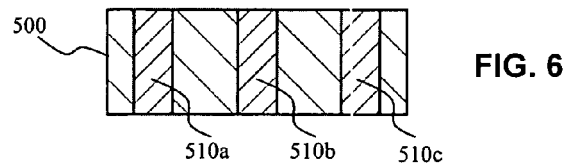
FIG. 6 is a cross sectional view of the connection chip of FIG. 5.

A second embodiment of the invention is shown in FIG. 4 and includes a semiconductor power device package 400 having a lead frame-based integrated inductor 450. The inductor 450 is comprised of the inductor core 200, a plurality of leads of the lead frame 100, and metal connections such as bonding wires 320d, 320e, 320i, 320j, 320k and 320m. A connection chip 500 provides electrical connection between bonding wires 320d, 320e, 320i, 320j, 320k and 320m and lead ends by means of vias 510a-510f formed in the connection chip 500 (FIG. 5 and FIG. 6). The inductor core 200 is attached to the top surface 150 of the lead frame 100 and is supported by the large pad 120 and the small pad 130. The inductor core 200 is disposed on the top surface 150 of the lead frame 100 in such manner that lead ends 140d-140f and 140j-140m are accessible through the offset window 210.

Connection chip 500 is sized and configured to fit within the offset window 210. Connection chip 500 is used to facilitate wire bonding in cases where the inductor core 200 and the offset window 210 are of a very small size and even the bottleneck bonding tool cannot be practically used. The connection chip 500 can also be utilized to avoid the need for a specialized bonding tool such as the bottleneck bonding tool. Vias 510a-510f are formed and positioned on the connection chip 500 such that they overlay the lead ends 140d-140f and 140j-140m of the lead frame 100, with conductive epoxy or solder providing electrical connection thereto. Vias 510a-510f are preferably plated with Cu. The connection chip 500 allows wire bonding to be conducted at or near the plane of the top surface 205 of the inductor core 200 so that a standard bonding tool may be used.

Bonding wires 320 couple a plurality of adjacent leads of the lead frame 100 to provide a closed magnetic circuit around the inductor core 200. Bonding wire 320d couples the end 140d of the lead 110d to the adjacent lead 110e through via 510a, the bonding wire 320d and the adjacent leads 110d and 110e forming a loop around the inductor core 200. Bonding wire 320e couples the end 140e of the lead 110e to the adjacent lead 110f through via 510b, the bonding wire 320e and the adjacent leads 110e and 110f forming a loop around the inductor core 200. Bonding wire 320m couples the end 140f of the lead 110f to the adjacent lead 110m through via 510c, the bonding wire 320m and the adjacent leads 110f and 110m forming a loop around the inductor core 200. Bonding wire 320k couples the end 140m of the lead 110m to the adjacent lead 110k through via 510f, the bonding wire 320k and the adjacent leads 110m and 110k forming a loop around the inductor core 200. Bonding wire 320j couples the end 140k of the lead 110k to the adjacent lead 110j through via 510e, the bonding wire 320j and the adjacent leads 110k and 110j forming a loop around the inductor core 100. Bonding wire 320i couples the end 140j of the lead 110j to the adjacent lead 110i through via 510d, the bonding wire 320i and the adjacent leads 110j and 110i forming a loop around the inductor core 200. Leads 110d and 110i comprise the leads of the inductor 450.

Figure 7:
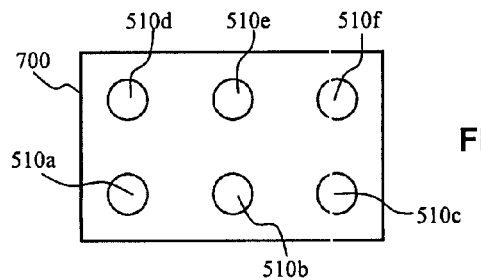
FIG. 7 is a top plan view of an alternative, single-sided bumped embodiment of the connection chip in accordance with the invention.
Figure 8:
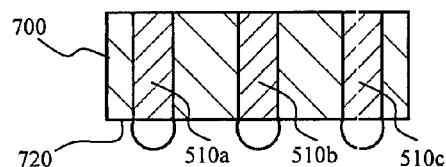
FIG. 8 is a cross sectional view of the single-sided bumped connection chip of FIG. 7.

Alternatively, a single-sided bumped connection chip 700 (FIG. 7 and FIG. 8) in all respects similar to the connection chip 500 with the exception of a bumped bottom surface 720 may be used to couple vias 510a-510f to lead ends 140d-140f.

A power IC 330 is attached to the open surface 205 of the inductor core 200. Bonding wire 320h couples the power IC 330 to the lead 110i and thereby to the lead frame-based integrated inductor 450. Bonding wires 320a, 320b, and 320c couple the power IC 330 to leads 110a, 110b and 110c respectively. Bonding wires 320f and 320g couple the power IC 330 to leads 110g and 110h respectively.

An encapsulant completes the semiconductor power device package 400 and fills the half-etched regions of the leads 110a-110m to lock the lead frame 100 so that leads won't detach from the package. The outline of the encapsulant is shown by a dashed line.

Figure 9:
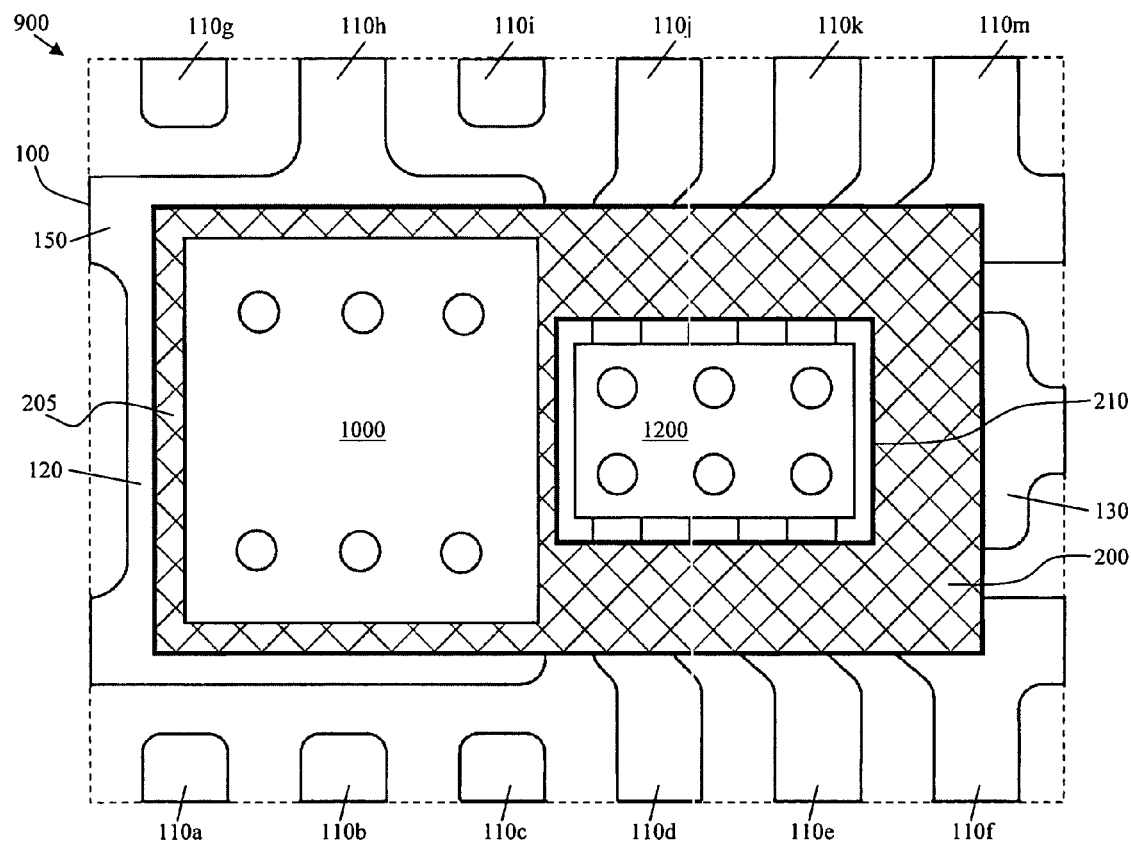
FIG. 9 is a top plan view of a bottom portion of a third embodiment of a semiconductor power device package having a lead frame-based integrated inductor in accordance with the invention.
Figure 12:
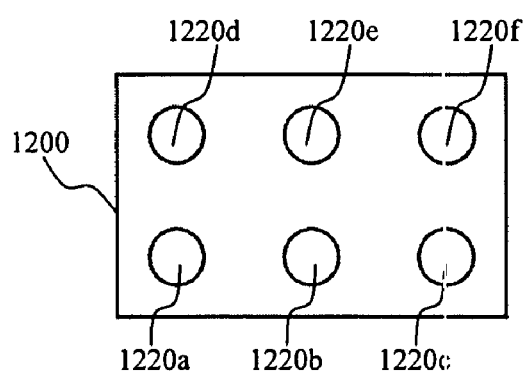
FIG. 12 is a top plan view of an alternative, double-sided bumped connection chip in accordance with the invention.
Figure 13:
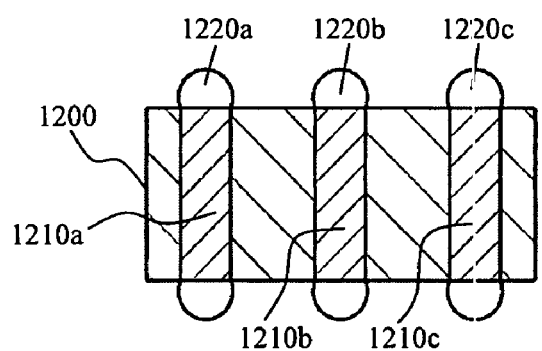
FIG. 13 is a cross sectional view of the bumped connection chip of FIG. 12.
Figure 14:
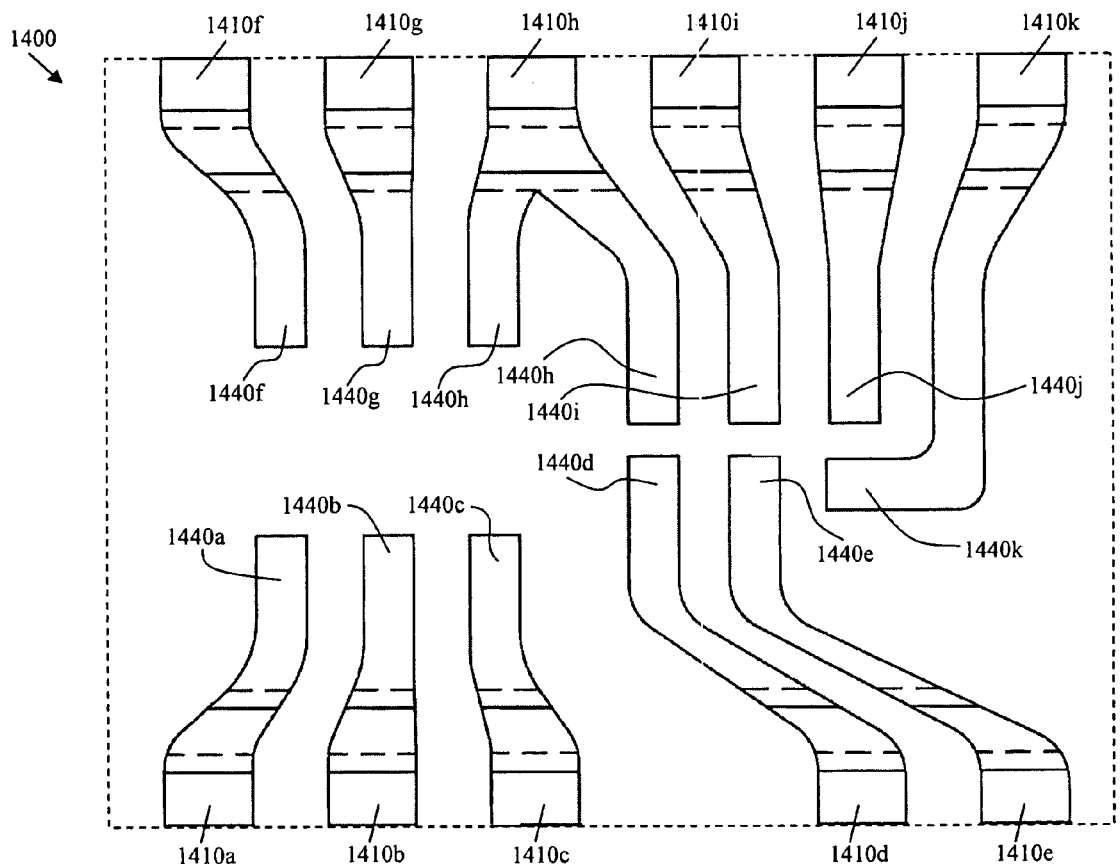
FIG. 14 is a top plan view of a top lead frame in accordance with the invention.
Figure 15:
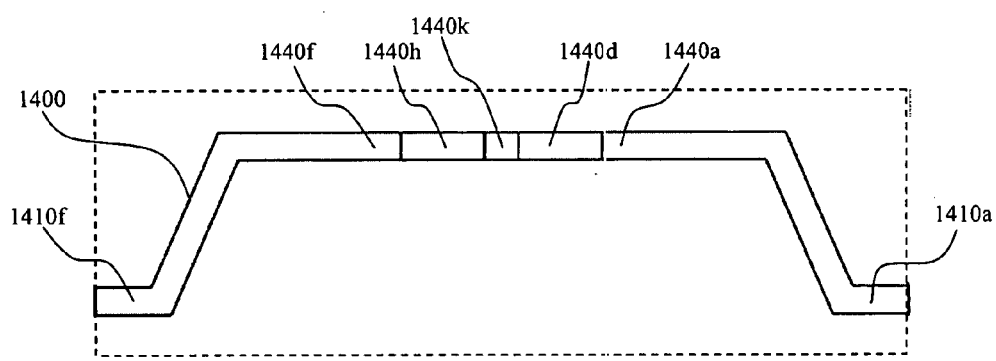
FIG. 15 is a side elevation view of the top lead frame of FIG. 14.
Figure 16:
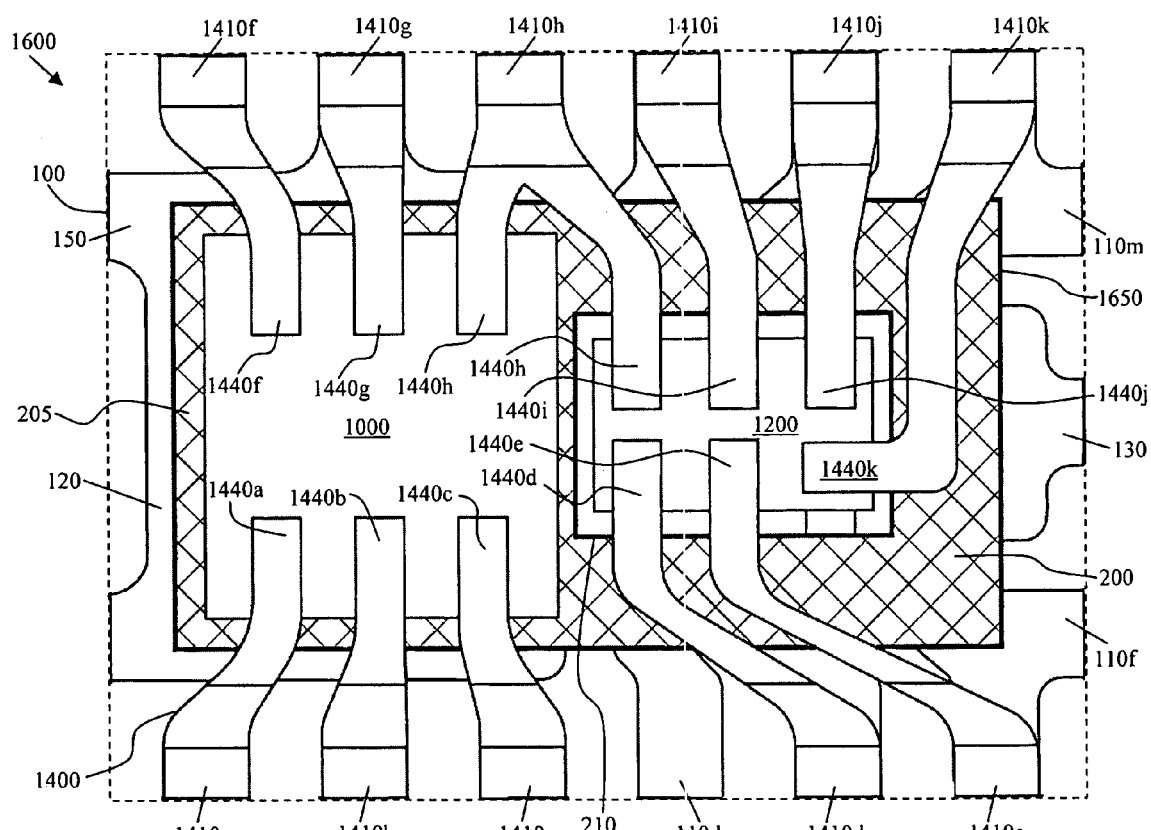
FIG. 16 is a top plan view of the third embodiment of the device package including the top lead frame in accordance with the invention.

A third embodiment of the invention is shown in FIG. 16 and includes a semiconductor power device package 1600 having a lead frame-based integrated inductor 1650 (FIG. 16). Semiconductor power device package 1600 is comprised of a bottom portion 900 (FIG. 9) and a top lead frame 1400 (FIG. 14 and FIG. 15). The bottom portion 900 comprises of a bottom lead frame 100, the inductor core 200, a bumped power IC 1000, and a connection chip 1200. The inductor 1650 is comprised of the inductor core 200, a plurality of adjacent leads of the lead frame 100 and a plurality of adjacent leads of the top lead frame 1400. A double-sided bumped connection chip 1200 (FIG. 12 and FIG. 13) provides electrical connection by means of vias formed in the connection chip 1200 (vias 1210a-1210c are shown in FIG. 13). The inductor core 200 is attached to the top surface 150 of the lead frame 100 and is supported by the large pad 120 and the small pad 130. The inductor core 200 is disposed on the top surface 150 of the lead frame 100 in such manner that lead ends 140d-140f and 140j-140m are accessible through the offset window 210.

The top lead frame 1400 includes a plurality of bent leads 1410a-1410k (FIG. 14 and FIG. 15). Leads 1410a-1410k have corresponding ends 1440a-1440k, lead end 1440h having two portions. Leads 1410a-1410c and 1410f-1410h are positioned and configured to couple a bumped power IC 1000 (FIG. 10 and FIG. 11) to respective leads 110a-110c and 110g-110i of the lead frame 100. The power IC 1000 is attached to the open surface 205 of the inductor core 200. Leads 1140d-1140e and 1440h-1440k are positioned and configured to couple the double-sided bumped connection chip 1200 to respective leads of the lead frame 100 about the inductor core 200 to form the inductor 1650 as further described.

Connection chip 1200 is sized and configured to fit within the offset window 210. Connection chip 1200 preferably has a thickness substantially equal to or slightly greater than the thickness of the inductor core 200. Alternatively the connection chip 1200 thickness can be substantially equal to the sum of the thicknesses of the bumped power IC 1000 and the inductor core 200. Connection chip vias are preferably plated with Cu. Connection chip vias are formed and positioned on the connection chip 1200 such that bottom side bumps formed on the vias overlay the lead ends 140d-140f and 140j-140m of the lead frame 100 for electrical connection thereto. Top side bumps 1220a-1220f formed on the vias are positioned to align with lead ends 1440d-1440e and 1440h-1440k of top lead frame leads 1410d-1414e and 1410h-1410k respectively.

Figure 10:
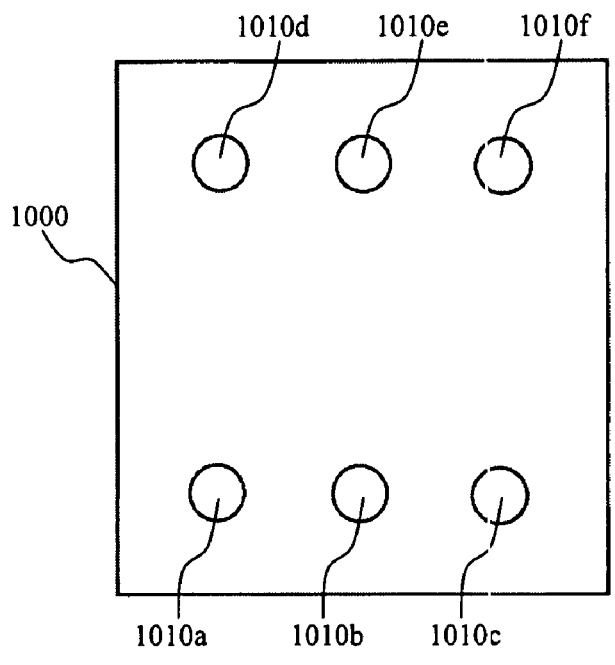
FIG. 10 is a top plan view of a bumped IC in accordance with the invention.
Figure 11:
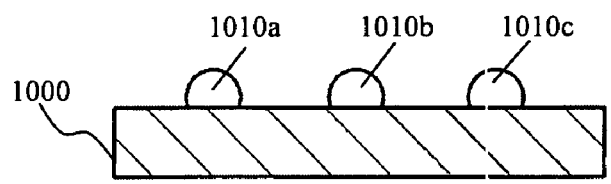
FIG. 11 is a cross sectional view of the bumped IC of FIG. 10.

With reference to FIG. 16, lead 1410d connects lead 110d to adjacent lead 110e of the lead frame 100, the lead 1410d and the adjacent leads 110d and 110e forming a loop around the inductor core 200. Lead 1410e connects lead 110e to adjacent lead 110f of lead frame 100, lead 1410e and the adjacent leads 110e and 110f forming a loop around the inductor core 200. Lead 110f is connected to adjacent lead 110m by lead 1440k, lead 1440k and the adjacent leads 110f and 110m forming a loop around the inductor core 200. Lead 110m is connected to adjacent lead 110k by lead 1410j, lead 1410j and adjacent leads 110m and 110k forming a loop around the inductor core 200. Lead 110k is connected to adjacent lead 110j by lead 1410i, lead 1410i and adjacent leads 110k and 110j forming a loop around the inductor core 200. Lead 110j is connected to adjacent lead 110i by a second portion of lead 1410h, the second portion of lead 1410h and the adjacent leads 110j and 110i forming a loop around the inductor core 200. Leads 110d and 110i/1410h form the leads of the inductor 1650. A first portion of lead 1410h is coupled to the power IC 1000 to thereby couple the power IC 1000 to the inductor 1650. Leads 1410a-1410c couple to bumps 1010a-1010c of the power IC 1000 (FIG. 10 and FIG. 11). Leads 1410f-1410h couple to bumps 1010d-1010f of the power IC 1000.

An encapsulant completes the semiconductor power device package 1600 and fills the half-etched regions of the leads 110a-110m to lock the lead frame 100 so that leads won't detach from the package. The outline of the encapsulant is shown by a dashed line.

Figure 17:
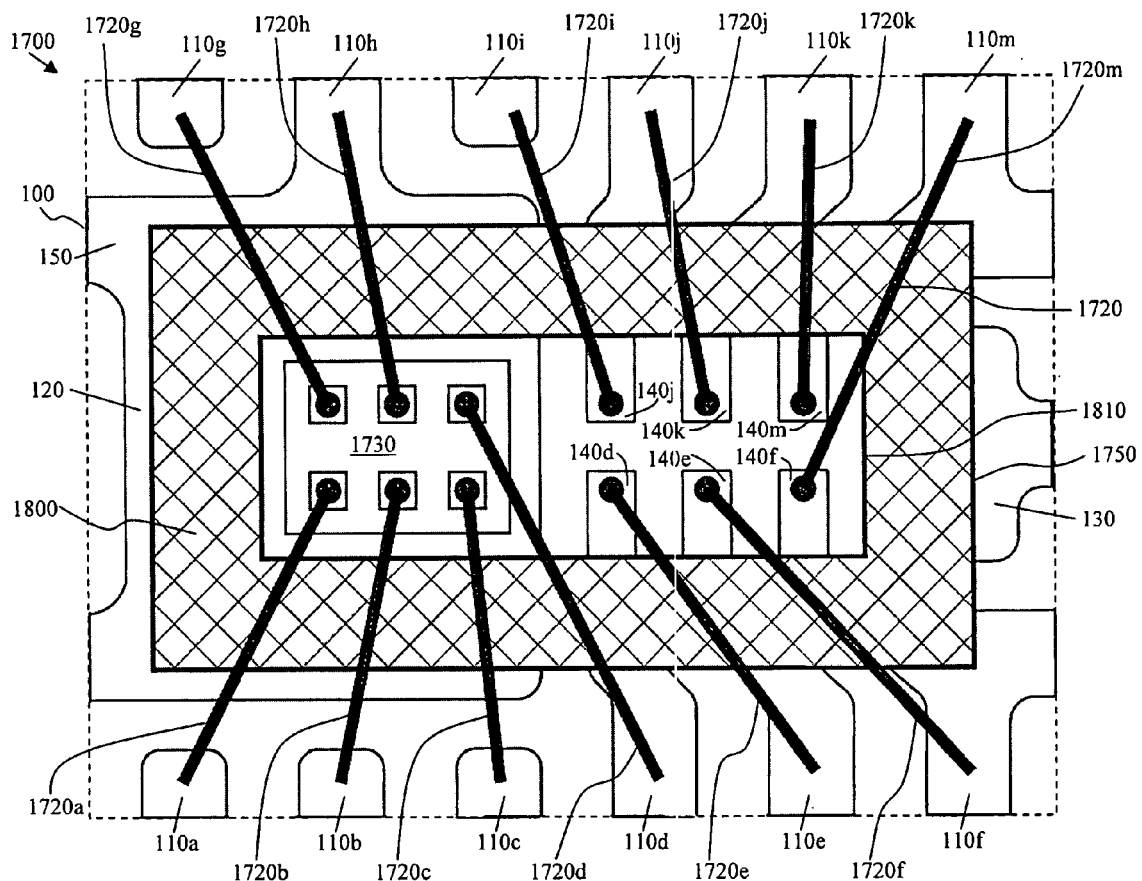
FIG. 17 is a top plan view of a fourth embodiment of a semiconductor power device package having a lead frame-based integrated inductor in accordance with the invention.
Figure 18:
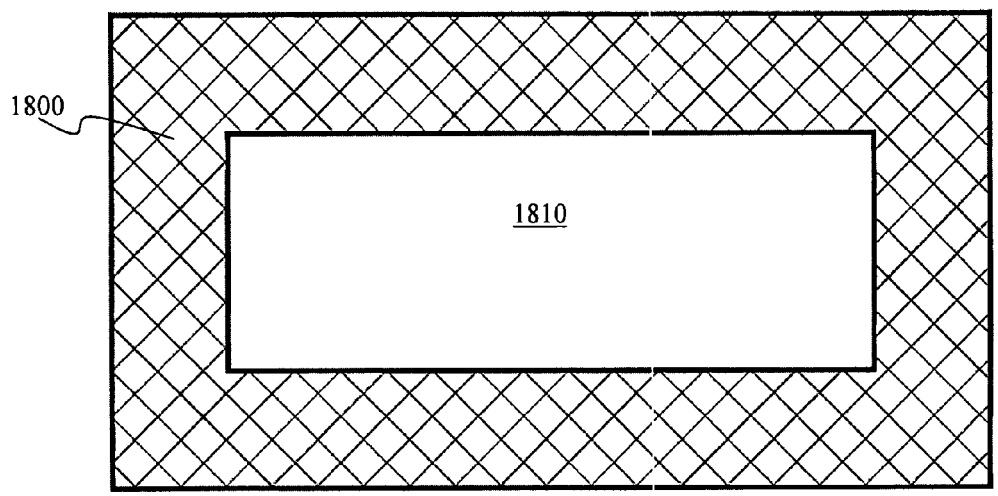
FIG. 18 is a top plan view of an alternative embodiment of the inductor core in accordance with the invention.

A fourth embodiment of the invention is shown in FIG. 17 and includes a semiconductor power device package 1700 having a lead frame-based integrated inductor 1750. The inductor 1750 is comprised of an inductor core 1800 (FIG. 18), a plurality of adjacent leads of the lead frame 100 and metal connections such as bonding wires 1720e, 1720f, 1720i, 1720j, 1720k and 1720m. The inductor core 1800 is attached to a top surface 150 of the lead frame 100 and is supported by the large pad 120 and the small pad 130. The inductor core 1800 is disposed on the top surface 150 of the lead frame 100 in such manner that lead ends 140d-140f and 140j-140m are accessible through a window 1810 formed in the inductor core 1800. A power IC 1730 is also accessible through the window 1810.

Bonding wires couple adjacent leads of the lead frame 100 to provide a closed magnetic circuit around the inductor core 1800. Bonding wire 1720e couples the end 140d of the lead 110d to the adjacent lead 110e, the bonding wire 1720e and the adjacent leads 110d and 110e forming a loop around the inductor core 1800. Bonding wire 1720f couples the end 140e of the lead 110e to the adjacent lead 110f, bonding wire 1720f and the adjacent leads 110e and 110f forming a loop around the inductor core 1800. Bonding wire 1720m couples the end 140f of the lead 110f to the adjacent lead 110m, the bonding wire 1720m and the adjacent leads 110f and 110m forming a loop around the inductor core 1800. Bonding wire 1720k couples the end 140m of the lead 110m to the adjacent lead 110k, the bonding wire 1720k and the adjacent leads 110m and 110k forming a loop around the inductor core 1800. Bonding wire 1720j couples the end 140k of the lead 110k to the adjacent lead 110j, the bonding wire 1720j and the adjacent leads 110k and 110j forming a loop around the inductor core 1800. Bonding wire 1720i couples the end 140j of the lead 110j to the adjacent lead 110i, the bonding wire 1720i and the adjacent leads 110j and 110i forming a loop around the inductor core 1800. Leads 110d and 110i comprise the leads of the inductor 1750.

The power IC 1730 is attached to the large pad 120 of the lead frame 100. Bonding wire 1720*d* couples the power IC 1730 to the lead 110*d* and thereby to the lead frame-based integrated inductor 1750. Bonding wires 1720*a*, 1720*b*, and 1720*c* couple the power IC 1730 to leads 110*a*, 110*b* and 110*c* respectively. Bonding wires 1720*g* and 1720*h* couple the power IC 1730 to leads 110*g* and 110*h* respectively.

As the dimensions of the window 1810 are small, access to the bonds therein may be limited and require the use of a bottleneck bonding tool such as the K&S Close Center Bond bottleneck bonding tool.

An encapsulant completes the semiconductor power device package 1700 and fills the shaded regions of the leads 110*a*-110*m* to lock the lead frame 100 so that leads won't detach from the package. The outline of the encapsulant is shown by a dashed line.

Figure 19:
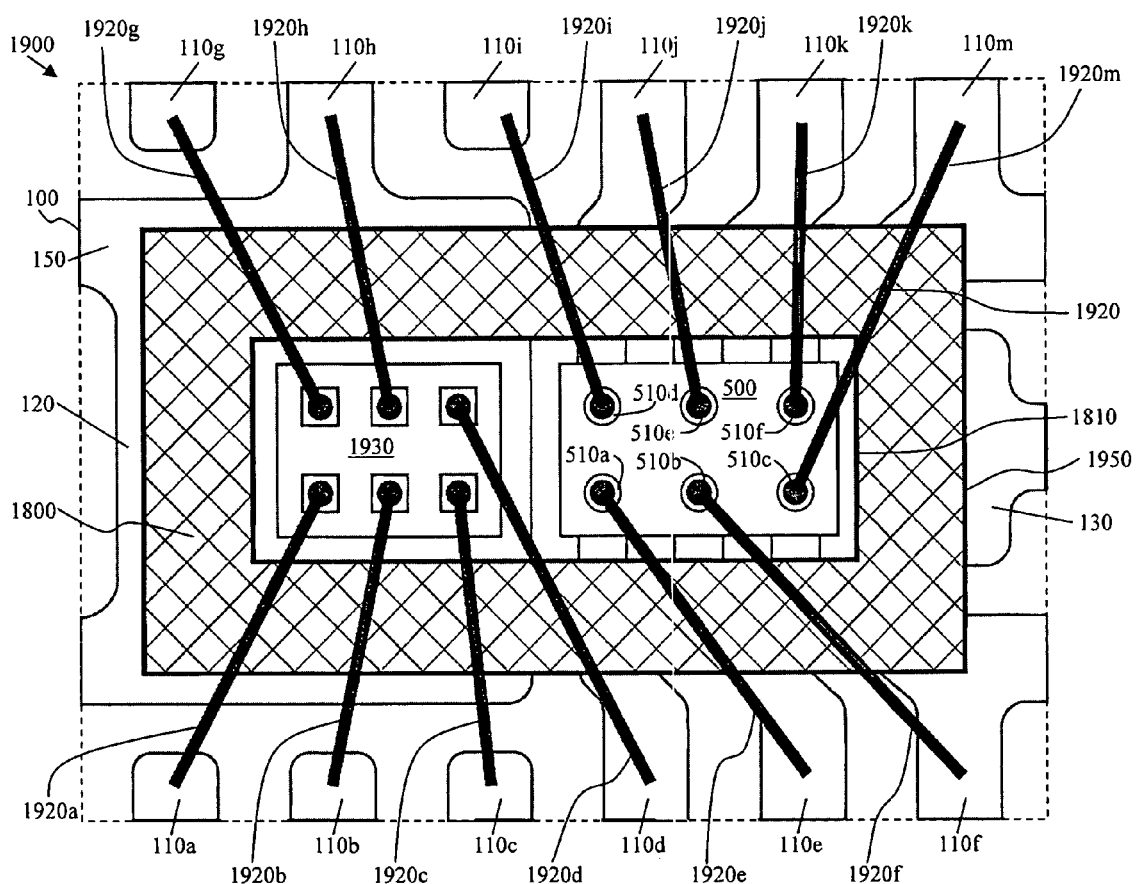
FIG. 19 is a top plan view of a fifth embodiment of a semiconductor power device package having a lead frame-based integrated inductor in accordance with the invention.

A fifth embodiment of the invention is shown in FIG. 19 and includes a semiconductor power device package 1900 having a lead frame-based integrated inductor 1950. The inductor 1950 is comprised of the inductor core 1800 (FIG. 18), a plurality of adjacent leads of the lead frame 100 and metal connections such as bonding wires 1920*e*, 1920*f*, 1920*i*, 1920*j*, 1920*k* and 1920*m*. Connection chip 500 provides electrical connection by means of vias 510*a*-510*f* formed in the connection chip 500 (FIG. 5 and FIG. 6). The inductor core 1800 is attached to a top surface 150 of the lead frame 100 and is supported by the large pad 120 and the small pad 130. The inductor core 1800 is disposed on the top surface 150 of the lead frame 100 in such manner that lead ends 140*d*-140*f* and 140*j*-140*m* are accessible through the window 1810. A power IC 1930 is also accessible through the window 1810.

Connection chip 500 is sized and configured to fit within the window 1810. Vias 510*a*-510*f* are formed and positioned on the connection chip 500 such that they overlay the lead ends 140*d*-140*f* and 140*j*-140*m* of the lead frame 100, with conductive epoxy or solder, for electrical connection thereto. The power IC 1930 is disposed adjacent the connection chip 500 in the window 1810.

Bonding wires couple adjacent leads of the lead frame 100 to provide a closed magnetic circuit around the inductor core 1800. Bonding wire 1920*e* couples the end 140*d* of the lead 110*d* to the adjacent lead 110*e* through via 510*a*, the bonding wire 1800. Bonding wire 1920*f* couples the end 140*e* of the lead 110*e* to the adjacent lead 110*f* through via 510*b*, the bonding wire 1920*f* and the adjacent leads 110*e* and 110*f* forming a loop around the inductor core 1800. Bonding wire 1920*m* couples the end 140*f* of the lead 110*f* to the adjacent lead 110*m* through via 510*c*, the bonding wire 1920*m* and the adjacent leads 110*f* and 110*m* forming a loop around the inductor core 1800. Bonding wire 1920*k* couples the end 140*m* of the lead 110*m* to the adjacent lead 110*k* through via 510*f*, the bonding wire 1920*k* and the adjacent leads 110*m* and 110*k* forming a loop around the inductor core 1800. Bonding wire 1920*j* couples the end 140*k* of the lead 110*k* to the adjacent lead 110*j* through via 510*e*, the bonding wire 1920*j* and the adjacent leads 110*k* and 110*j* forming a loop around the inductor core 1800. Bonding wire 1920*i* couples the end 140*j* of the lead 110*j* to the adjacent lead 110*i* through via 510*d*, the bonding wire 1920*i* and the adjacent leads 110*j* and 110*i* forming a loop around the inductor core 1800. Leads 110*d* and 110*i* comprise the leads of the inductor 1950.

The power IC 1930 is attached to the large pad 120 of the lead frame 100. Bonding wire 1920*d* couples the power IC 1930 to the lead 110*d* and thereby to the lead frame-based integrated inductor 1950. Bonding wires 1920*a*, 1920*b*, and 1920*c* couple the power IC 1930 to leads 110*a*, 110*b* and 110*c* respectively. Bonding wires 1920*g* and 1920*h* couple the power IC 1930 to leads 110*g* and 110*h* respectively.

Due to the utilization of the connection chip 500, use of a specialized bonding tool such as the K&S Close Center Bond bottleneck bonding tool is not required—a standard bonding tool will suffice.

An encapsulant completes the semiconductor power device package 1900 and fills the half-etched regions of the leads 110*a*-110*m* to lock the lead frame 100 so that leads are unlikely to detach from the package. The outline of the encapsulant is shown by a dashed line.

Figure 20:
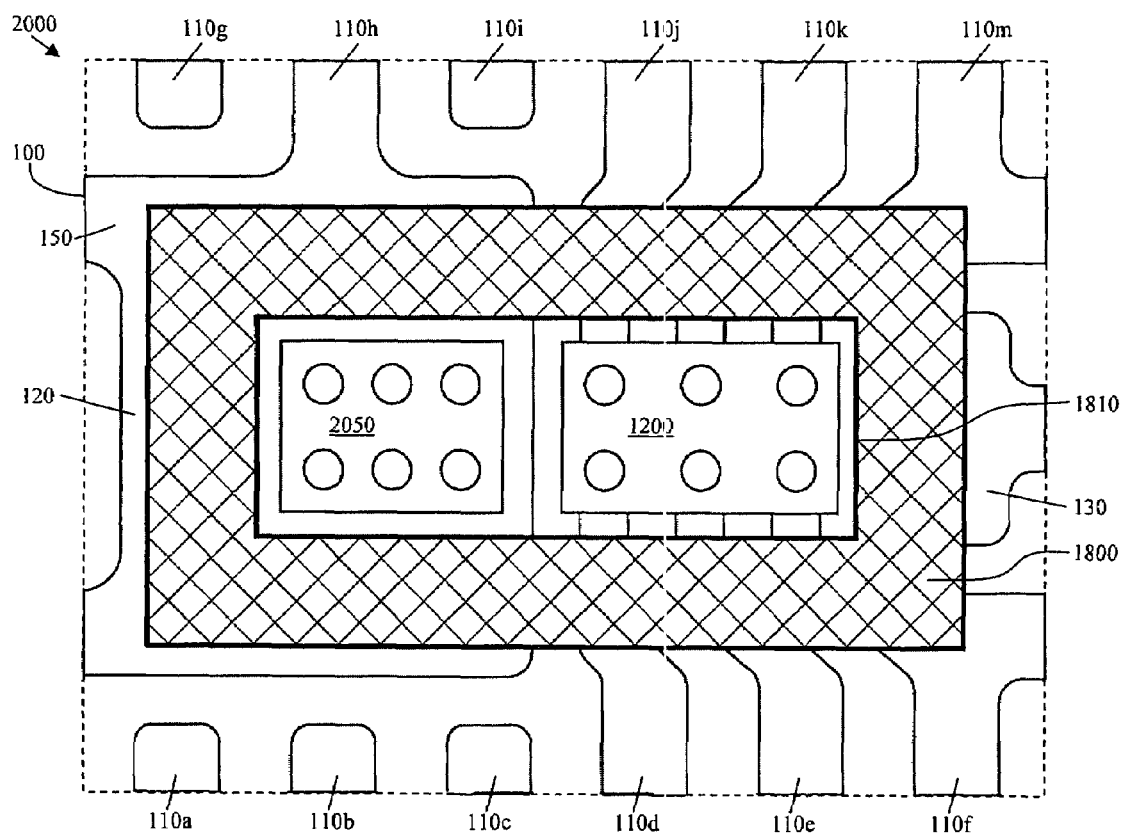
FIG. 20 is a top plan view of a bottom portion of a sixth embodiment of a semiconductor power device package having a lead frame-based integrated inductor in accordance with the invention.
Figure 21:
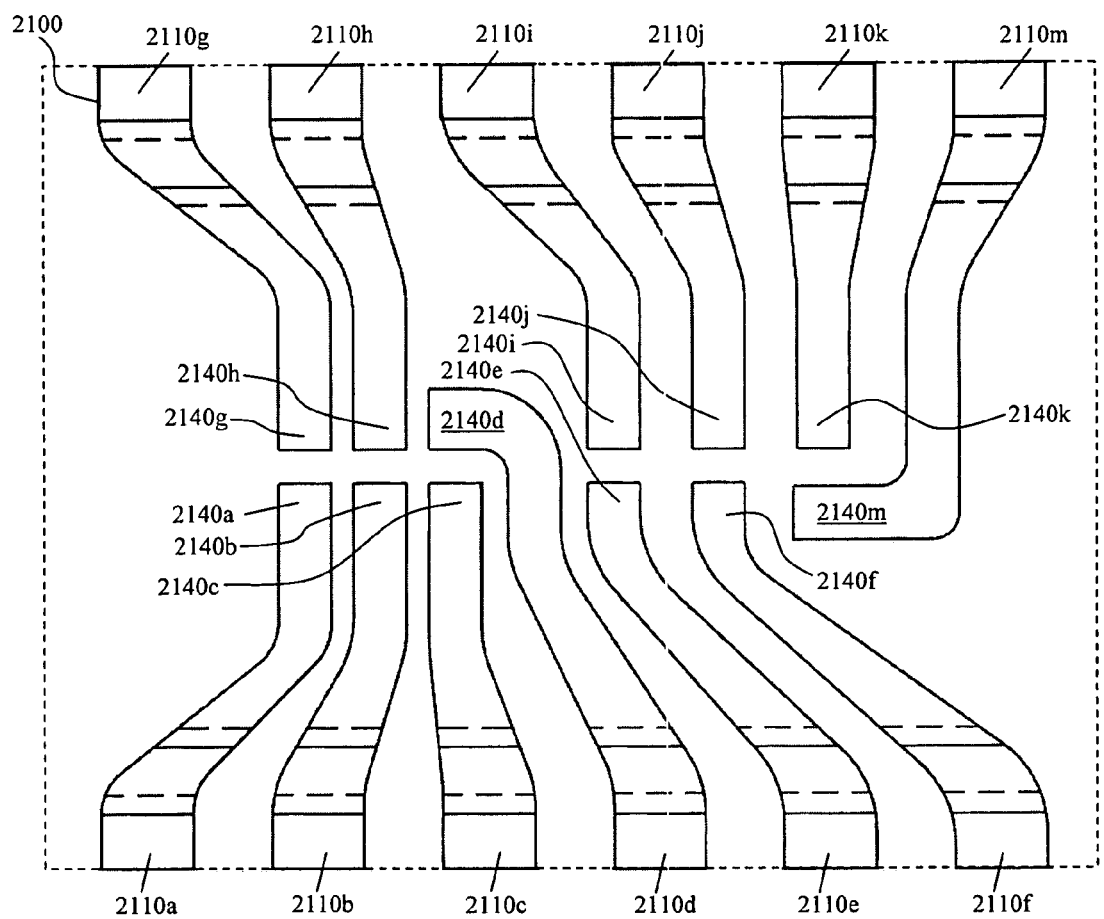
FIG. 21 is a top plan view of an alternative embodiment of the top lead frame in accordance with the invention.
Figure 22:
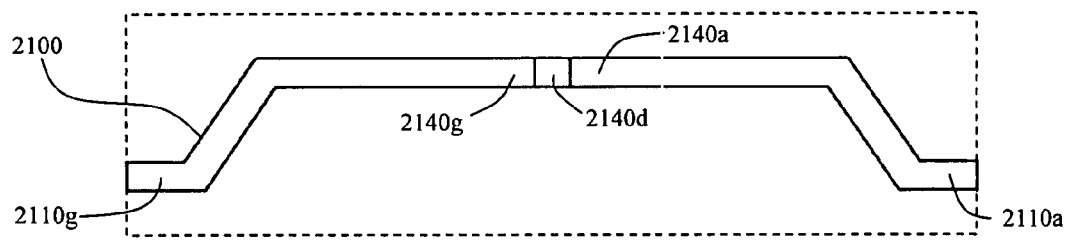
FIG. 22 is a side elevation view of the top lead frame of FIG. 21.
Figure 23:
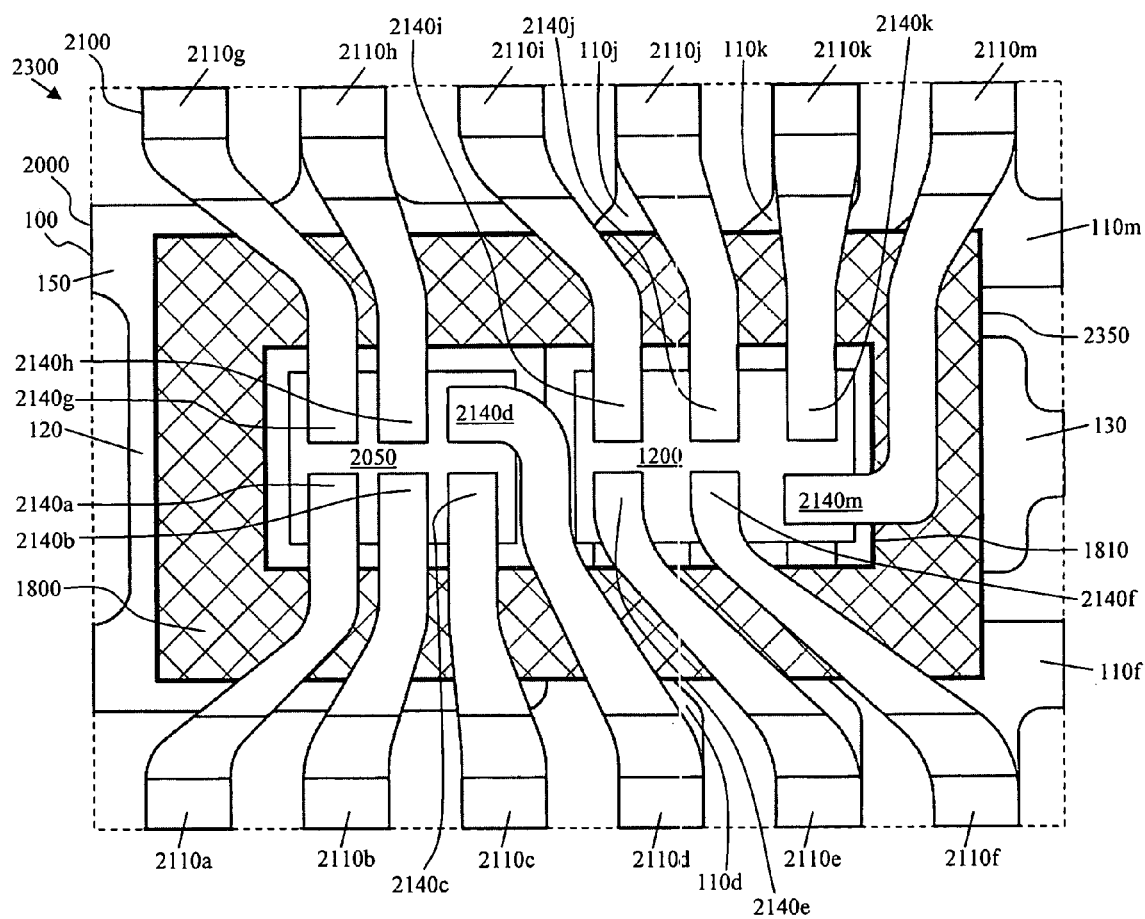
FIG. 23 is a top plan view of the sixth embodiment of the device package including the top lead frame in accordance with the invention.

A sixth embodiment of the invention is shown in FIG. 23 and includes a semiconductor power device package 2300 having a lead frame-based integrated inductor 2350. Semiconductor power device package 2300 is comprised of a bottom portion 2000 (FIG. 20) and a top lead frame 2100 (FIG. 21 and FIG. 22). The bottom portion 2000 includes the bottom lead frame 100, the inductor core 1800, a power IC chip 2050 and a connection chip 1200. The inductor 2350 is comprised of the inductor core 1800, a plurality of adjacent leads of the lead frame 100, and a plurality of adjacent leads of the top lead frame 2100. A double-sided bumped connection chip 1200 (FIG. 12 and FIG. 13) provides electrical connection by means of vias formed in the connection chip 1200 (vias 1210*a*-1210*c* are shown in FIG. 13). The inductor core 1800 is attached to the top surface 150 of the lead frame 100 and is supported by the large pad 120 and the small pad 130. The inductor core 1800 is disposed on the top surface 150 of the lead frame 100 in such manner that lead ends 140*d*-140*f* and 140*j*-140*m* are accessible through the window 1810.

The top lead frame 2100 includes a plurality of bent leads 2110*a*-2110*m*. Leads 2110*a*-2110*m* have corresponding ends 2140*a*-2140*m*. Leads 2110*a*-2110*d* and 2110*g*-2110*i* are positioned and configured to couple the bumped power IC 2050 to respective leads 110*a*-110*d* and 110*g*-110*h* of the lead frame 100. The power IC 2050 is disposed in the window 1810 adjacent the connection chip 1200. Leads 2140*e*-2140*f* and 2140*i*-2140*m* are positioned and configured to couple the double-sided bumped connection chip 1200 to respective leads of the lead frame 100 about the inductor core to form the inductor 2350 as further described.

Connection chip 1200 is sized and configured to fit within the window 1810 and has a thickness substantially equal to or slightly greater than the thickness of the inductor core 1800. Connection chip vias are formed and positioned on the connection chip 1200 such that bottom side bumps formed on the vias overlay the lead ends 140*d*-140*f* and 140*j*-140*m* of the lead frame 100 for electrical connection thereto. Top side bumps 1220*a*-1220*f* formed on the vias are positioned to align with lead ends 2140*e*-2140*f* and 2140*i*-2140*m* of top lead frame leads 2110*e*-2110*f* and 2110*i*-2110*m* respectively.

With reference to FIG. 23, the lead 2110*e* connects lead 110*d* to adjacent lead 110*e* of the lead frame 100, the lead 2110*e* and the adjacent leads 110*d* and 110*e* forming a loop around the inductor core 1800. Lead 2110*f* connects lead 110*e* to adjacent lead 110*f* of lead frame 100, the lead 2110*f* and the adjacent leads 110*e* and 110*f* forming a loop around the inductor core 1800. Lead 110*f* is connected to adjacent lead 110*m* by the lead 2140*m*, lead 2140*m* and adjacent leads 110*f* and 110*m* forming a loop around the inductor core 1800. Lead 110*m* is connected to adjacent lead 110*k* by the lead 2110*k*, the lead 2110*k* and adjacent leads 110*m* and 110*k* forming a loop around the inductor core 1800. Lead 110*k* is connected to adjacent lead 110*j* by the lead 2110*j*, the lead 2110*j* and adjacent leads 110*k* and 110*j* forming a loop around the inductor core 1800. Lead 110*j* is connected to adjacent lead 110i by the lead 2110i, the lead 2110i and adjacent leads 110j and 110i forming a loop around the inductor core 1800. Leads 110d and 110i form the leads of the inductor 2350. Lead 2110d is coupled to the power IC 2050 to thereby couple the power IC 2050 to the inductor 2350. Lead 2110d is also a part of inductor 2350 as it contributes part of a loop around the inductor core 1800. Leads 2110a-2110c and 2110g-2110h couple to bumps formed on the power IC 2050.

An encapsulant completes the semiconductor power device package 2300 and fills the half-etched regions of the leads 110a-110m to lock the lead frame 100 so that leads are unlikely to detach from package. The outline of the encapsulant is shown by a dashed line.

Figure 24:
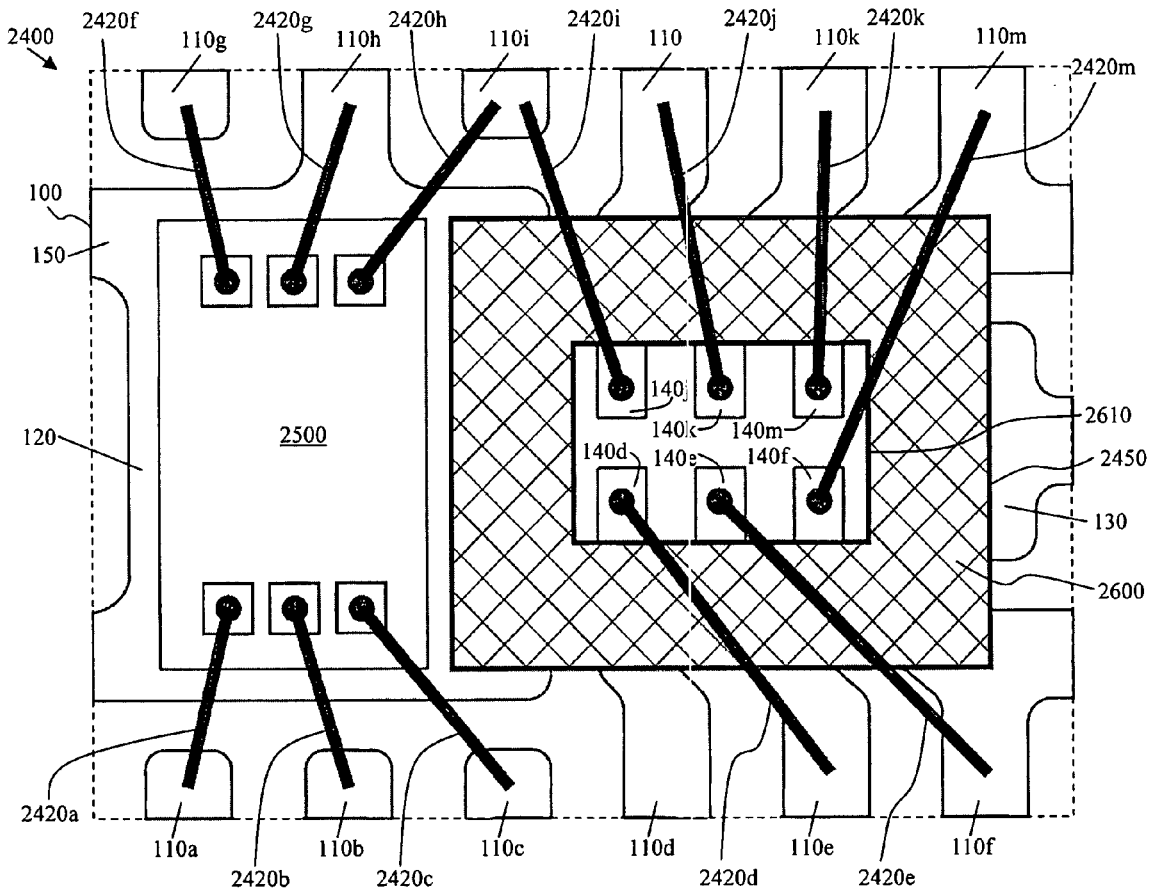
FIG. 24 is a top plan view of a seventh embodiment of a semiconductor power device package having a lead frame-based integrated inductor in accordance with the invention.
Figure 25:
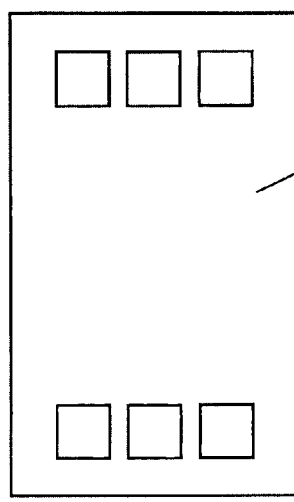
FIG. 25 is a top plan view of a power IC in accordance with the invention.
Figure 26:
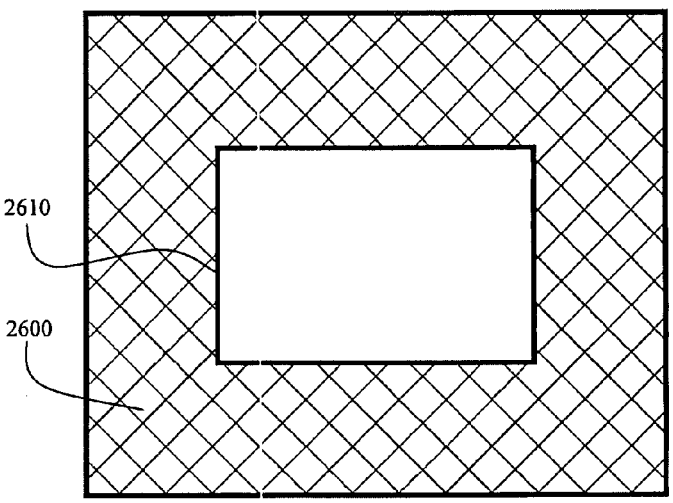
FIG. 26 is a top plan view of an alternative embodiment of the inductor core in accordance with the invention.

A seventh embodiment of the invention is shown in FIG. 24 and includes a semiconductor power device package 2400 having a lead frame-based integrated inductor 2450. The inductor 2450 is comprised of an inductor core 2600 (FIG. 26), a plurality of adjacent leads of the lead frame 100 and metal connections such as bonding wires 2420d, 2420e, 2420i, 2420j, 2420k and 2420m. The inductor core 2600 is attached to a top surface 150 of the lead frame 100 and is supported by the large pad 120 and the small pad 130. The inductor core 2600 is disposed on the top surface 150 of the lead frame 100 in such manner that lead ends 140d-140f and 140j-140m are accessible through a window 2610 centered in the inductor core 2600. A power IC 2500 (FIG. 25) is disposed on the large pad 120 adjacent to the inductor core 2600.

Bonding wires couple adjacent leads of the lead frame 100 to provide a closed magnetic circuit around the inductor core 2600. Bonding wire 2420d couples the end 140d of the lead 110d to the adjacent lead 110e, the bonding wire 2410d and adjacent leads 110d and 110e forming a loop around the inductor core 2600. Bonding wire 2420e couples the end 140e of the lead 110e to the adjacent lead 110f, the bonding wire 2420e and adjacent leads 110e and 110f forming a loop around the inductor core 2600. Bonding wire 2420m couples the end 140f of the lead 110f to the adjacent lead 110m, bonding wire 2420m and adjacent leads 110f and 110m forming a loop around the inductor core 2600. Bonding wire 2420k couples the end 140m of the lead 110m to the adjacent lead 110k, the bonding wire 2420k and adjacent leads 110m and 110k forming a loop around the inductor core 2600. Bonding wire 2420j couples the end 140k of the lead 110k to the adjacent lead 110j, the bonding wire 2420j and adjacent leads 110k and 110j forming a loop around the inductor core 2600. Bonding wire 2420i couples the end 140j of the lead 110j to the adjacent lead 10i, the bonding wire 2420i and adjacent leads 110j and 110i forming a loop around the inductor core 2600. Leads 110d and 110i comprise the leads of the inductor 2450.

As the dimensions of the window 1810 are small, access to the bonds therein may be limited and require the use of a bottleneck bonding tool such as the K&S Close Center Bond bottleneck bonding tool.

The power IC 2500 is attached to the large pad 130 of the lead frame 100. Bonding wire 2420h couples the power IC 2500 to the lead 110i and thereby to the lead frame-based integrated inductor 2450. Bonding wires 2420a, 2420b, and 2420c couple the power IC 2500 to leads 110a, 110b and 110c respectively. Bonding wires 2420f and 2420g couple the power IC 2500 to leads 110g and 110h respectively.

An encapsulant completes the semiconductor power device package 2400 and fills the half-etched regions of the leads 110a-110m to lock the lead frame 100 so that leads are unlikely to detach from the package. The outline of the encapsulant is shown by a dashed line.

Figure 27:
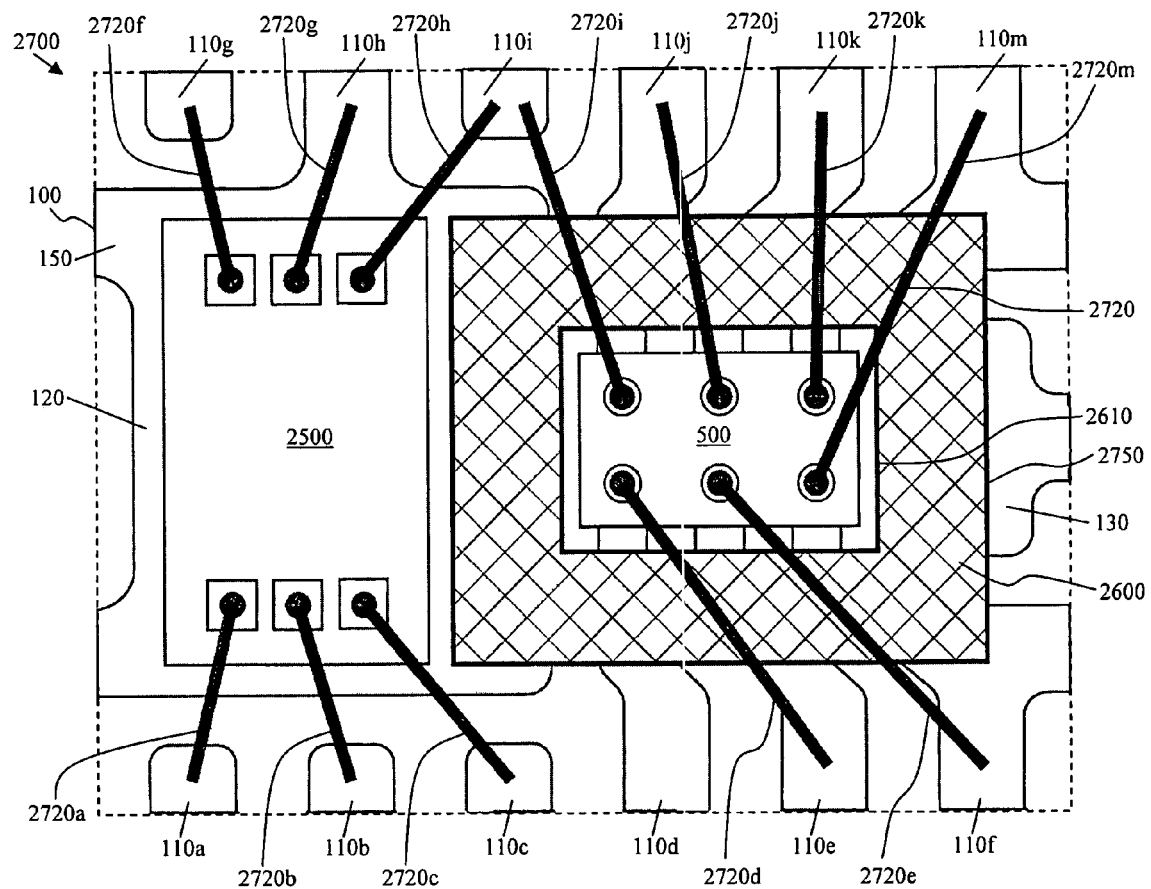
FIG. 27 is a top plan view of a eighth embodiment of a semiconductor power device package having a lead frame-based integrated inductor in accordance with the invention.

An eighth embodiment of the invention is shown in FIG. 27 and includes a semiconductor power device package 2700 having a lead frame-based integrated inductor 2750. The inductor 2750 is comprised of the inductor core 2600, a plurality of adjacent leads of the lead frame 100, and metal connections such as bonding wires 2720d, 2720e, 2720i, 2720j, 2720k and 2720m. A connection chip 500 provides electrical connection by means of vias 510a-510f formed in the connection chip 500. The inductor core 2600 is attached to a top surface 150 of the lead frame 100 and is supported by the large pad 120 and the small pad 130. The inductor core 2600 is disposed on the top surface 150 of the lead frame 100 in such manner that lead ends 140d-140f and 140j-140m are accessible through a window 2610 centered in the inductor core 2600. Power IC 2500 is disposed on the large pad 120.

Connection chip 500 is sized and configured to fit within the window 2610. Vias 510a-510g are preferably plated with Cu to facilitate wire bonding in cases where the inductor core 2600 and the offset window 2610 are of a very small size and the bottleneck bonding tool cannot be practically used. Vias 510a-510f are formed and positioned on the connection chip 500 such that they overlay the lead ends 140d-140f and 140j-140m of the lead frame 100, with conductive epoxy or solder, for electrical connection thereto.

Bonding wires couple adjacent leads of the lead frame 100 to provide a closed magnetic circuit around the inductor core 2600 as follows. Bonding wire 2720d couples the end 140d of the lead 110d to the lead 110e through via 510a, the bonding wire 2720d and adjacent leads 110d and 110e forming a loop around the inductor core 1600. Bonding wire 2720e couples the end 140e of the lead 110e to the adjacent lead 110f through via 510b, the bonding wire 2720e and adjacent leads 110e and 110f forming a loop around the inductor core 2600. Bonding wire 2720m couples the end 140f of the lead 110f to the adjacent lead 110m through via 510c, the bonding wire 2720m and adjacent leads 110f and 110m forming a loop around the inductor core 2600. Bonding wire 2720k couples the end 140m of the lead 110m to the adjacent lead 110k through via 510f, the bonding wire 2720k and adjacent leads 110m and 110k forming a loop around the inductor core 1600. Bonding wire 2720j couples the end 140k of the lead 110k to the adjacent lead 110j through via 510e, the bonding wire 2720j and adjacent leads 110k and 110j forming a loop around the inductor core 2600. Bonding wire 2720i couples the end 140j of the lead 110j to the adjacent lead 110i through via 510d, the bonding wire 2720i and adjacent leads 110j and 110i forming a loop around the inductor core 2600. Leads 110d and 110i comprise the leads of the inductor 2750.

Power IC 2500 is attached to the large pad 120 of the lead frame 100. Bonding wire 2720h couples the power IC 2500 to the lead 110i and thereby to the lead frame-based integrated inductor 2750. Bonding wires 2720a, 2720b, and 2720c couple the power IC 2500 to leads 110a, 110b and 110c respectively. Bonding wires 2720f and 2720g couple the power IC 2500 to leads 110g and 110h respectively.

An encapsulant completes the semiconductor power device package 2700 and fills the half-etched regions of the leads 110a-110m to lock the lead frame 100, so that leads are unlikely to detach from the package. The outline of the encapsulant is shown by a dashed line.

Figure 28:
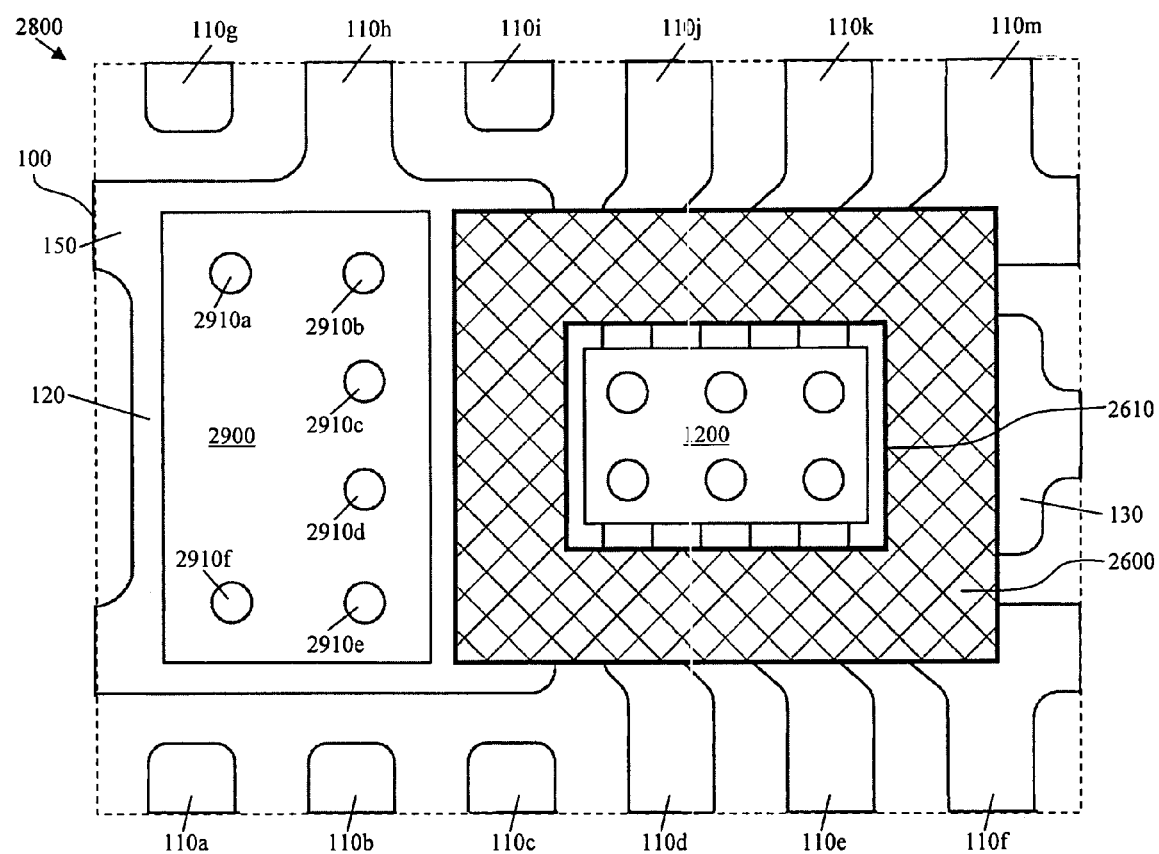
FIG. 28 is a top plan view of a bottom portion of a ninth embodiment of a semiconductor power device package having a lead frame-based integrated inductor in accordance with the invention.
Figure 31:
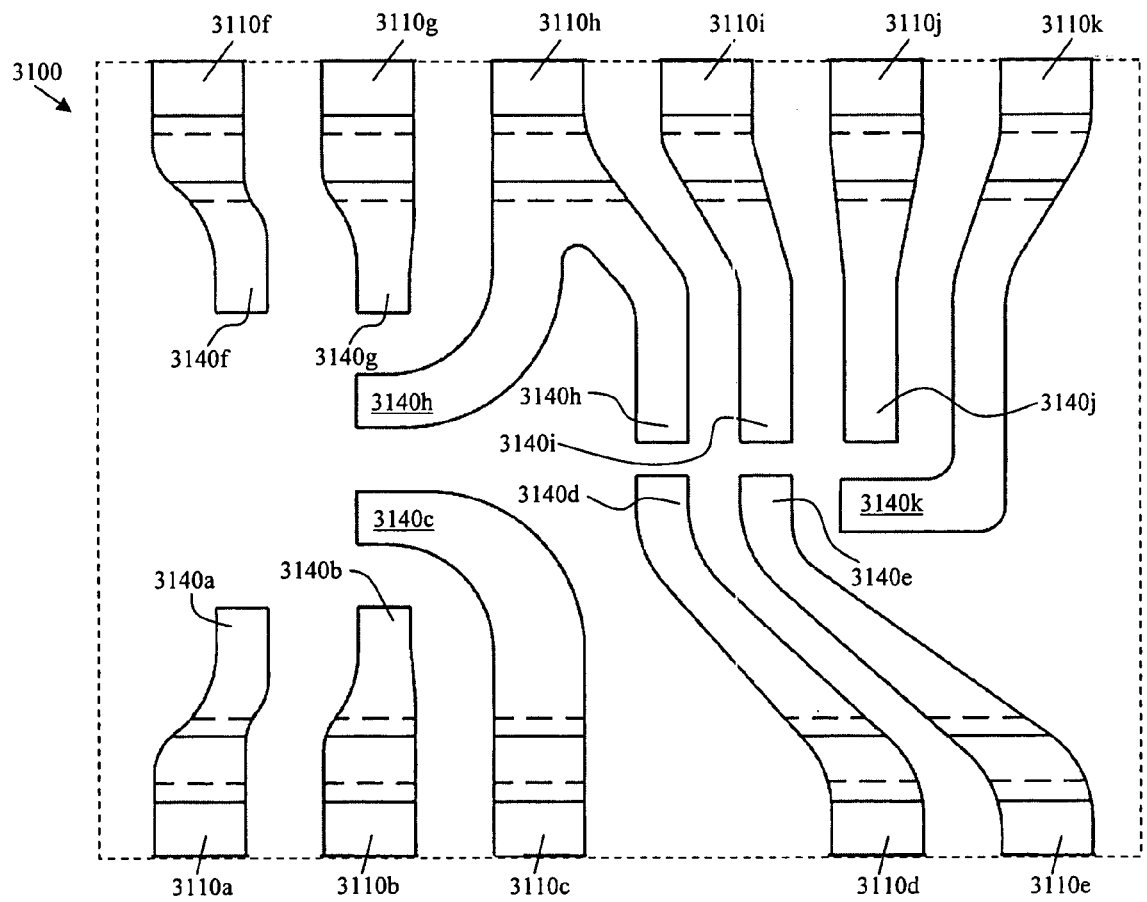
FIG. 31 is a top plan view of an alternative embodiment of the top lead frame in accordance with the invention.
Figure 32:
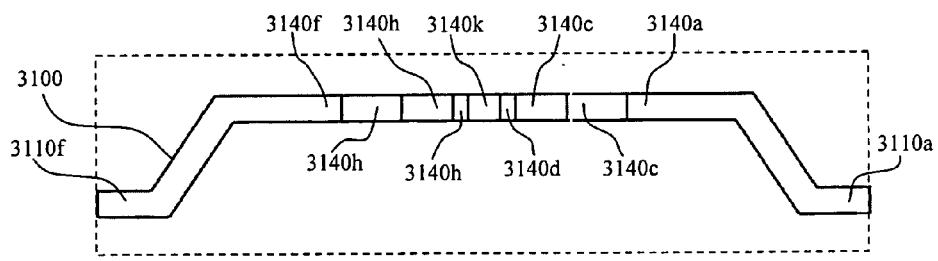
FIG. 32 is a side elevation view of the top lead frame of FIG. 31.
Figure 33:
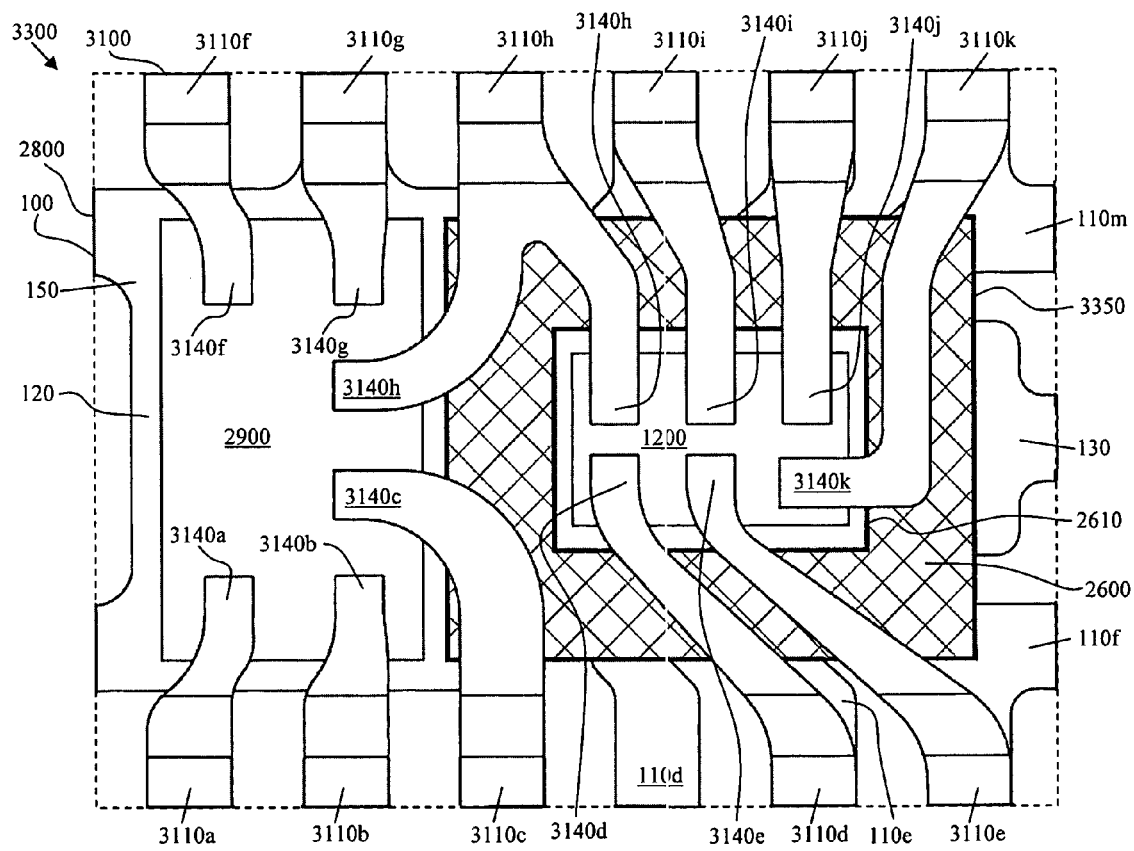
FIG. 33 is a top plan view of the ninth embodiment of the device package including the top lead frame in accordance with the invention.

A ninth embodiment of the invention is shown in FIG. 33 and includes a semiconductor power device package 3300 having a lead frame-based integrated inductor 3350. Semiconductor power device package 3300 is comprised of a bottom portion 2800 (FIG. 28) and a top lead frame 3100 (FIG. 31). The bottom portion 2800 includes the bottom lead frame 100, the inductor core 2600, the connection chip 1200, and a power IC 2900. The inductor 3350 is comprised of the inductor core 2600, a plurality of adjacent leads of the lead frame 100 and a plurality of adjacent leads of the top lead frame 3100. The double-sided bumped connection chip 1200 provides electrical connection by means of vias formed in the connection chip 1200 (vias 1210*a*-1210*c* are shown in FIG. 13). The inductor core 2600 is attached to the top surface 150 of the lead frame 100 and is supported by the large pad 120 and the small pad 130. The inductor core 2600 is disposed on the top surface 150 of the lead frame 100 in such manner that lead ends 140*d*-140*f* and 140*j*-140*m* are accessible through the window 2610.

Figure 29:
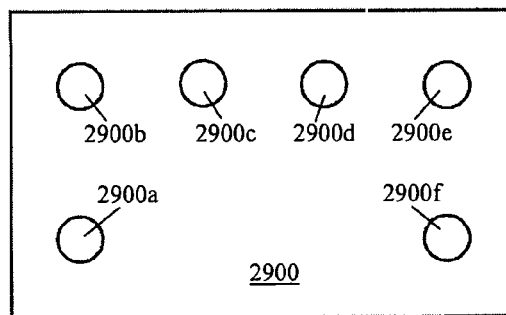
FIG. 29 is a top plan view of a bumped power IC in accordance with the invention.
Figure 30:
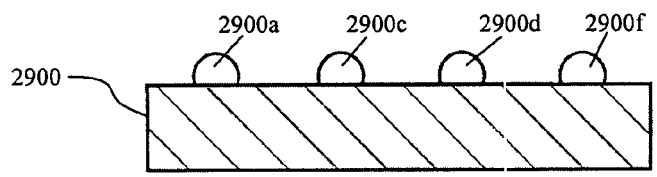
FIG. 30 is a cross sectional view of the bumped power IC of FIG. 29.

The top lead frame 3100 includes a plurality of bent leads 3110*a*-3110*k*. Leads 3110*a*-3110*k* have corresponding ends 3140*a*-3140*k*, lead end 3140*h* having two portions. Leads 3110*a*-3110*c* and 3110*f*-3110*h* are positioned and configured to couple a bumped power IC 2900 (FIG. 29) to respective leads 110*a*-110*c* and 110*g*-110*i* of the lead frame 100. The power IC 2900 is attached to the large pad 120 of the lead frame 100 adjacent the inductor core 2600. Leads 3140*d*-3140*e* and 3140*h*-3140*k* are positioned and configured to couple the double-sided bumped connection chip 1200 to respective leads of the lead frame 100 about the inductor core 2600 to form the inductor 3350 as further described.

Connection chip 1200 is sized and configured to fit within the window 2610, and has a thickness substantially equal to or slightly greater than the thickness of the inductor core 2600. Connection chip vias are preferably plated with Cu to facilitate electrical connection with small resistance. Connection chip vias are formed and positioned on the connection chip 1200 such that bottom side bumps formed on the vias overlay the lead ends 140*d*-140*f* and 140*j*-140*m* of the lead frame 100 for electrical connection thereto. Top side bumps 1220*a*-1220*f* formed on the vias are positioned to align with lead ends 3140*d*-3140*e* and 3140*h*-3140*k* of top lead frame leads 3110*d*-3114*e* and 3110*h*-3110*k* respectively.

With reference to FIG. 33, lead 3110*d* connects lead 110*d* to adjacent lead 110*e* of the lead frame 100, the lead 3110*d* and adjacent leads 110*d* and 110*e* forming a loop around the inductor core 2600. Lead 3110*e* connects lead 110*e* to adjacent lead 110*f* of lead frame 100, the lead 3110*e* and adjacent leads 110*e* and 110*f* forming a loop around the inductor core 2600. Lead 110*f* is connected to adjacent lead 110*m* by lead 3140*k*, the lead 3140*k* and adjacent leads 110*f* and 110*m* forming a loop around the inductor core 2600. Lead 110*m* is connected to adjacent lead 110*k* by lead 3110*j*, the lead 3110*j* and adjacent leads 110*m* and 110*k* forming a loop around the inductor core 2600. Lead 110*k* is connected to adjacent lead 110*j* by lead 3110*i*, the lead 3110*i* and adjacent leads 110*k* and 110*j* forming a loop around the inductor core 2600. Lead 110*j* is connected to adjacent lead 110*i* by a second portion of lead 3110*h*, the second portion of lead 3110*h* and adjacent leads 110*j* and 110*i* forming a loop around the inductor core 2600. Leads 110*d* and 110*i* form the leads of the inductor 3350. A first portion of lead 3110*h* is coupled to the power IC 2900 to thereby couple the power IC 2900 to the inductor 3350. Leads 3110*a*-3110*c* couple to bumps 2910*f*, 2910*e* and 2910*d* of the power IC 2900. Leads 3110*f*-3110*h* (first portion) couple to bumps 2910*a*, 2910*b* and 2910*c* of the power IC 2900.

An encapsulant (not shown) completes the semiconductor power device package 3300 and fills the half-etched regions of the leads 110*a*-110*m* to lock the lead frame 100 so that leads are unlikely to detach from the package. The outline of the encapsulant is shown by a dashed line.

Figure 34A:
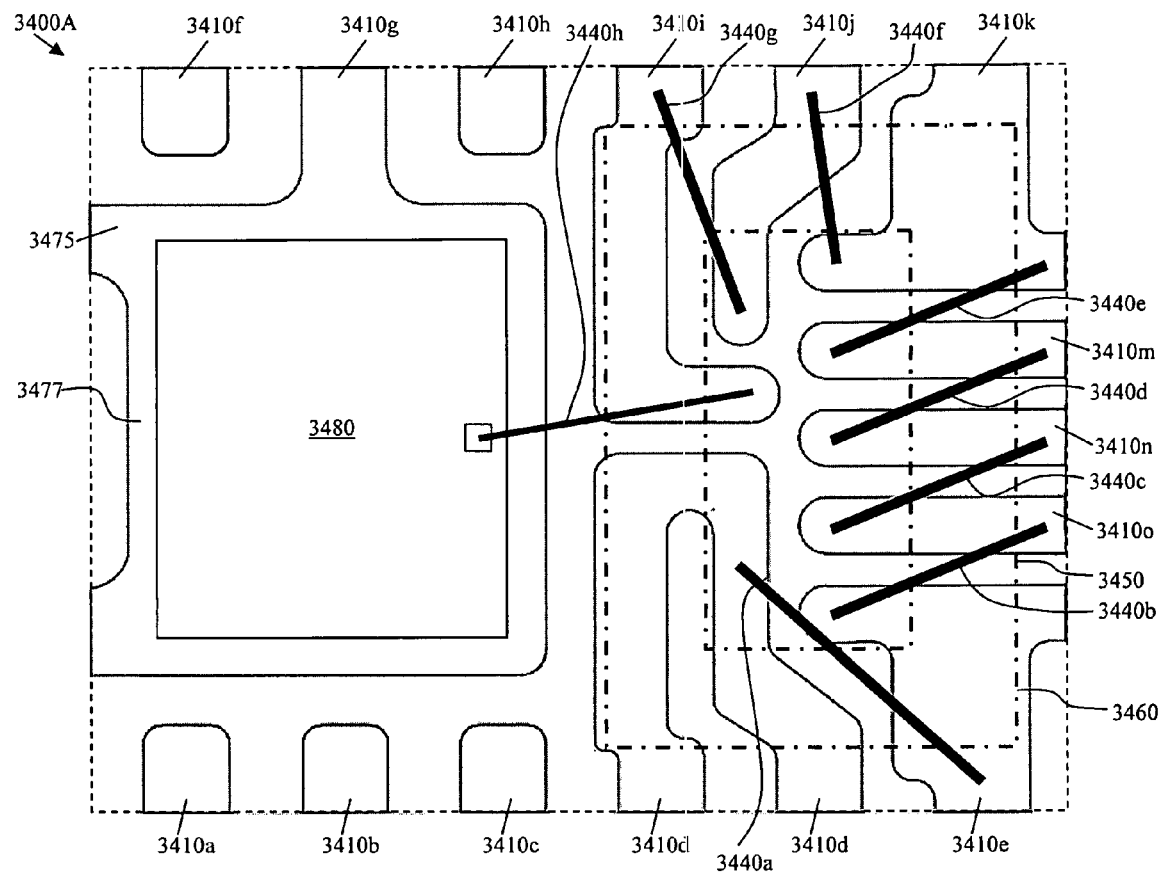
FIG. 34A is a top plan view of a tenth embodiment of a semiconductor power device package having a lead frame-based integrated inductor in accordance with the invention.

A tenth embodiment of the invention is shown in FIG. 34A and includes a semiconductor power device package 3400A having a lead frame-based integrated inductor 3450. The inductor 3450 is comprised of an inductor core 3460, a plurality of adjacent leads of a lead frame 3470 and metal connections such as bonding wires 3440*a*-3440*g*. The inductor core 3460 is attached to a top surface 3475 of the lead frame 3470. The inductor core 3460 is disposed on the top surface 3475 of the lead frame 3470 in such manner that lead ends 3440*d*-3440*e* and 3440*i*-3440*o* are accessible through a window 3465 formed in the inductor core 3460.

Bonding wires couple adjacent leads of the lead frame 3470 to provide a closed magnetic circuit around the inductor core 3460. Bonding wire 3440*a* couples the lead 3410*d* to the adjacent lead 3410*e*, the bonding wire 3440*a* and adjacent leads 3410*d* and 3410*e* forming a loop around the inductor core 3460. Bonding wire 3440*b* couples the lead 3410*e* to the adjacent lead 3410*o*, the bonding wire 3440*b* and adjacent leads 3410*e* and 3410*o* forming a loop around the inductor core 3460. Bonding wire 3440*c* couples the lead 3410*o* to the adjacent lead 3410*n*, the bonding wire 3440*c* and adjacent leads 34310*o* and 3410*n* forming a loop around the inductor core 3460. Bonding wire 3440*d* couples the lead 3410*n* to the lead 3410*m*. Bonding wire 3440*e* couples the lead 3410*m* to the adjacent lead 3410*k*, bonding wire 3440*e* and adjacent leads 3410*m* and 3410*k* forming a loop around the inductor core 3460. Bonding wire 3440*f* couples the lead 3410*k* to the adjacent lead 3410*j*, bonding wire 3440*f* and adjacent leads 3410*k* and 3410*j* forming a loop around the inductor core 3460. Bonding wire 3440*g* couples the lead 3410*j* to the adjacent lead 3410*i*, bonding wire 3440*g* and adjacent leads 3410*j* and 3410*i* forming a loop around the inductor core 3460. Bonding wire 3440*h* couples the lead 3410*i* to a power IC 3480 disposed on a pad 3477 of the lead frame 3470. Leads 3410*d* and 3410*i* comprise the leads of the inductor 3450. The semiconductor power device package 3400A comprises a 12L 4×3 DFN-0.65 mm pitch device. The outer boundary and the inner window of the inductor core 3460 are indicated by the dash-dot-dash line.

An encapsulant completes the semiconductor power device package 3400A and locks the lead frame 3470 so that the leads are unlikely to detach from the package. The outline of the encapsulant is shown by a dashed line.

Figure 34B:
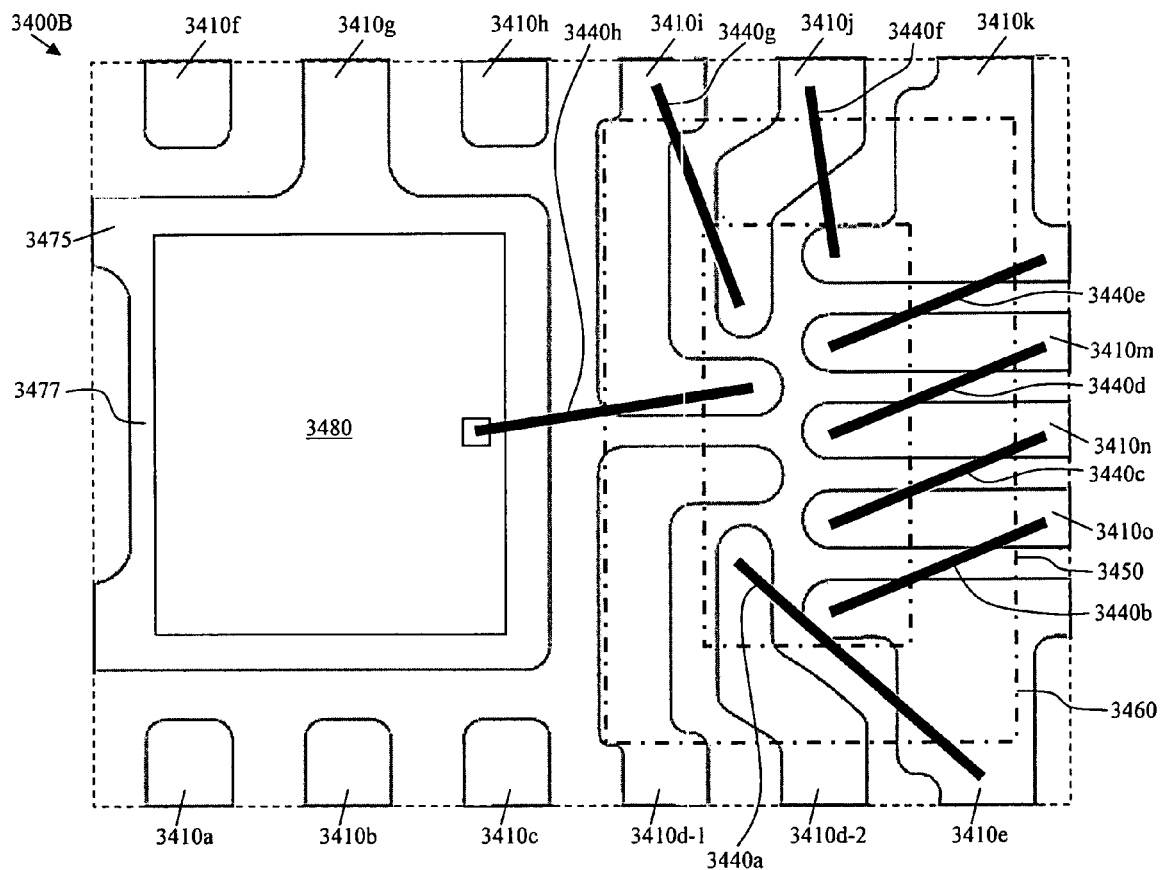
FIG. 34B is a top plan view of an alternate embodiment of a tenth embodiment of a semiconductor power device package having a lead frame-based integrated inductor in accordance with the invention.

An alternate embodiment of the semiconductor power device package 3400A is shown in FIG. 34B and generally designated 3400B. Device package 3400B is essentially the same as package 3400A except that device package 3400B includes the lead 3410*d* separated into two leads 3410*d*-1 and 3410*d*-2. In this embodiment, lead 3410*d*-1 can be used as an extra lead.

The inductor cores in accordance with the invention may be fabricated from a magnetic material substrate. The substrate is ground to a desired thickness. Next the windows are cut using a laser or other etching process. The substrate is then mounted onto a dicing tape and diced into the individual inductor cores.

The semiconductor power device package having a lead frame-based integrated inductor is generally fabricated by providing the lead frame to which is attached the inductor core. The power IC is then attached to either the inductor core, a position adjacent the inductor core or within the window of the inductor core. If a connection chip is used, the connection chip is attached to the lead ends exposed within the window. Connections between the lead frame leads to form the inductor are provided using either metal connections including wire bonding or a top lead frame. In a final step, molding is used to encapsulate the device package.

The semiconductor power device package having a lead frame-based integrated inductor in accordance with the invention reduces cost by eliminating duplicative assembly costs and the cost of a discrete inductor. The semiconductor power device in accordance with the invention further provides for a simple solution to power converter or booster device packages that minimizes the amount of board space used.

It is apparent that the above embodiments may be altered in many ways without departing from the scope of the invention. Further, various aspects of a particular embodiment may contain patentably subject matter without regard to other aspects of the same embodiment. Still further, various aspects of different embodiments can be combined together. Accordingly, the scope of the invention should be determined by the following claims and their legal equivalents.

What is claimed is:

1. A semiconductor power device package having a lead frame-based integrated inductor comprising:
    a lead frame having a plurality of leads;
    an inductor core attached to the lead frame such that a plurality of lead ends are exposed through a window formed in the inductor core;
    a plurality of metal connections, ones of the plurality of metal connections coupling ones of the plurality of lead ends exposed through the window to adjacent leads about the inductor core to form the inductor;
    a connection chip disposed in the window, the connection chip providing electrical connection between the ones of the plurality of metal connections and the ones of the plurality of lead ends exposed through the window; and
    a power integrated circuit coupled to the inductor.

2. The semiconductor power device package of claim 1, wherein the power integrated circuit is attached onto the inductor core adjacent the window.

3. The semiconductor power device package of claim 1, wherein the inductor core is between 0.2 mm and 1 mm thick.

4. The semiconductor power device package of claim 1, wherein the inductor core comprises a gap.

5. The semiconductor power device package of claim 1, wherein the inductor core comprises ferrite.

6. The semiconductor power device package of claim 1, wherein the inductor core comprises nanocrystalline NiFe.

7. The semiconductor power device package of claim 1, wherein the inductor core comprises NiFe.

8. The semiconductor power device package of claim 1, wherein the connection chip comprises a plurality of vias, ones of the plurality of vias providing electrical connection between the ones of the plurality of metal connections and the ones of the plurality of lead ends exposed through the window.

9. The semiconductor power device package of claim 1, wherein the connection chip is bumped on a bottom side thereof.

10. The semiconductor power device package of claim 1, wherein the power integrated circuit is disposed in the window adjacent the plurality of lead ends exposed through the window.

11. The semiconductor power device package of claim 1, wherein the power integrated circuit is disposed adjacent the inductor core.

12. A semiconductor power device package having a lead frame-based integrated inductor comprising:
    a bottom lead frame having a plurality of leads;
    a inductor core attached to the bottom lead frame such that a plurality of bottom lead frame lead ends are exposed through a window formed in the inductor core;
    a connection chip bumped on opposite sides thereof such that each bump on a top side is electrically connected to a corresponding bump on a bottom side, the connection chip disposed in the window such that the bottom side bumps overlay the plurality of bottom lead frame lead ends exposed through the window and are electrically coupled thereto;
    a top lead frame having a plurality of bent leads, ones of a first plurality of the top lead frame leads coupled to connection chip top side bumps and coupling each of the plurality of bottom lead frame lead ends exposed through the window to adjacent bottom lead frame lead ends about the inductor core to form the inductor; and
    a power integrated circuit coupled to the inductor.

13. The semiconductor power device package of claim 12, wherein the power integrated circuit is attached onto the inductor core adjacent the window.

14. The semiconductor power device package of claim 12, wherein the power integrated circuit is disposed in the window adjacent the plurality of bottom lead frame lead ends exposed through the window.

15. The semiconductor power device package of claim 12, wherein the power integrated circuit is disposed adjacent the inductor core.

16. The semiconductor power device package of claim 12, wherein the integrated circuit is bumped on a top surface and ones of a second plurality of top lead frame leads couple the integrated circuit to the inductor and to ones of a corresponding plurality of bottom lead frame leads.

17. The semiconductor power device package of claim 12, wherein the inductor core is between 0.2 mm and 1 mm thick.

18. The semiconductor power device package of claim 12, wherein the inductor core comprises a gap.

19. The semiconductor power device package of claim 12, wherein the inductor core comprises nanocrystalline NiFe.

20. The semiconductor power device package of claim 12, wherein the inductor core comprises ferrite.

21. The semiconductor power device package of claim 12, wherein the inductor core comprises NiFe.

22. The semiconductor power device package of claim 12, wherein the connection chip comprises a plurality of vias.

23. A method of forming a semiconductor power device package having a lead frame-based integrated inductor comprising the steps of:
    providing a bottom lead frame having a plurality of leads;
    attaching an inductor core to the bottom lead frame such that a plurality of bottom lead frame lead ends are exposed through a window formed in the inductor core;
    coupling each of the plurality of lead ends exposed through the window to adjacent leads about the inductor core by means of a plurality of metal connections to form the inductor,
    wherein the step of coupling each of the plurality of lead ends exposed through the window to adjacent leads about the inductor core by means of a plurality of metal connections further comprises a step of disposing a connection chip bumped on opposite sides thereof in the window such that bottom side bumps overlay the plurality of bottom lead frame lead ends exposed through the window and are electrically coupled thereto, and wherein each of the top side bumps of the connection chip is electrically connected to a corresponding bottom side bump of the connection chip; and
    coupling a power integrated circuit to the inductor.

24. The method of forming a semiconductor power device package of claim 23, wherein the step of coupling each of the plurality of lead ends to adjacent leads about the inductor core by means of a plurality of metal connections further comprises a step of providing a top lead frame having a plurality of leads, ones of a first set of the plurality of top lead frame leads coupled to connection chip top side bumps and coupling each of the plurality of bottom lead frame lead ends exposed through the window to adjacent bottom lead frame lead ends about the inductor core.

* * * * *